(12) United States Patent
Lee et al.

(10) Patent No.: US 10,304,834 B2
(45) Date of Patent: May 28, 2019

(54) SEMICONDUCTOR DEVICES AND METHOD OF FABRICATING THE SAME

(71) Applicant: SAMSUNG ELECTRONICS CO., LTD., Suwon-si, Gyeonggi-do (KR)

(72) Inventors: Sangmoon Lee, Hwasung-si (KR); Jungtaek Kim, Hwasung-si (KR); Yihwan Kim, Hwasung-si (KR); Woo Bin Song, Hwasung-si (KR); Dongsuk Shin, Hwasung-si (KR); Seung Ryul Lee, Hwasung-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/939,914

(22) Filed: Mar. 29, 2018

(65) Prior Publication Data

US 2019/0067285 A1 Feb. 28, 2019

(30) Foreign Application Priority Data

Aug. 30, 2017 (KR) .................. 10-2017-0110353

(51) Int. Cl.
| | |
|---|---|
| H01L 29/78 | (2006.01) |
| H01L 27/092 | (2006.01) |
| H01L 21/84 | (2006.01) |
| H01L 29/66 | (2006.01) |
| H01L 21/8238 | (2006.01) |
| H01L 27/088 | (2006.01) |
| H01L 27/12 | (2006.01) |

(52) U.S. Cl.
CPC .. *H01L 27/0924* (2013.01); *H01L 21/823821* (2013.01); *H01L 21/845* (2013.01); *H01L 27/0886* (2013.01); *H01L 29/6681* (2013.01); *H01L 29/66795* (2013.01); *H01L 29/66818* (2013.01); *H01L 29/785* (2013.01); *H01L 29/7853* (2013.01); *H01L 27/1211* (2013.01)

(58) Field of Classification Search
None
See application file for complete search history.

(56) References Cited

U.S. PATENT DOCUMENTS

| | | | |
|---|---|---|---|
| 8,716,156 B1 | 5/2014 | Pawlak et al. | |
| 8,937,299 B2 | 1/2015 | Basu et al. | |
| 9,252,157 B2 | 2/2016 | Czornomaz et al. | |
| 9,412,664 B2 | 8/2016 | Leobandung | |
| 9,450,093 B2 | 9/2016 | Chen et al. | |
| 9,496,185 B2 | 11/2016 | Cai et al. | |
| 9,502,541 B2 | 11/2016 | Vellianitis et al. | |
| 9,548,355 B1 | 1/2017 | Cheng et al. | |
| 9,570,443 B1 | 2/2017 | Balakrishnan et al. | |
| 9,607,987 B2 | 3/2017 | Giles et al. | |
| 9,741,809 B2 * | 8/2017 | Shah ............... | H01L 29/42384 |
| 2008/0242010 A1 | 10/2008 | Rhee et al. | |

(Continued)

*Primary Examiner* — Minh Loan Tran
(74) *Attorney, Agent, or Firm* — Lee & Morse, P.C.

(57) ABSTRACT

A semiconductor device and a method of fabricating a semiconductor device, the device including a substrate; an active pattern spaced apart from the substrate and extending in a first direction; and a gate structure on the active pattern and extending in a second direction crossing the first direction, wherein a lower portion of the active pattern extends in the first direction and includes a first lower surface that is sloped with respect to an upper surface of the substrate.

19 Claims, 29 Drawing Sheets

(56) References Cited

U.S. PATENT DOCUMENTS

| | | |
|---|---|---|
| 2013/0248948 A1 | 9/2013 | Ma et al. |
| 2015/0318399 A1* | 11/2015 | Jeong .................. H01L 29/7853 257/401 |
| 2016/0005829 A1 | 1/2016 | Shah et al. |
| 2016/0204195 A1 | 7/2016 | Wen et al. |
| 2016/0329327 A1* | 11/2016 | Lee .................... H01L 27/0886 |
| 2016/0365440 A1 | 12/2016 | Suk et al. |
| 2017/0133225 A1 | 5/2017 | Lee et al. |

* cited by examiner

US 10,304,834 B2

SEMICONDUCTOR DEVICES AND METHOD OF FABRICATING THE SAME

CROSS-REFERENCE TO RELATED APPLICATION

Korean Patent Application No. 10-2017-0110353, filed on Aug. 30, 2017, in the Korean Intellectual Property Office, and entitled: "Semiconductor Devices and Method of Fabricating the Same," is incorporated by reference herein in its entirety.

BACKGROUND

1. Field

Embodiments relate to semiconductor devices and method of fabricating the same.

2. Description of the Related Art

A semiconductor device may include an integrated circuit (IC) composed of a plurality of metal oxide semiconductor field-effect transistors (MOSFETs).

SUMMARY

The embodiments may be realized by providing a semiconductor device including a substrate; an active pattern spaced apart from the substrate and extending in a first direction; and a gate structure on the active pattern and extending in a second direction crossing the first direction, wherein a lower portion of the active pattern extends in the first direction and includes a first lower surface that is sloped with respect to an upper surface of the substrate.

The embodiments may be realized by providing a semiconductor device including a substrate; a pair of active patterns spaced apart from the substrate; and a gate structure extending across the pair of active patterns, wherein a lower portion of each active pattern of the pair of active patterns includes a lower surface sloped with respect to an upper surface of the substrate, the lower portion of each active pattern of the pair of active patterns extending in a direction crossing an extension direction of the gate structure.

The embodiments may be realized by providing a method of fabricating a semiconductor device, the method including forming insulating patterns on a substrate such that the insulating patterns includes an opening exposing a portion of an upper surface of the substrate; sequentially growing a sacrificial semiconductor layer and an active layer using the exposed portion of the upper surface of the substrate as a seed; performing a planarization process to expose an upper surface of the sacrificial semiconductor layer and to separate the active layer into spaced active patterns with the sacrificial semiconductor layer therebetween; removing the sacrificial semiconductor layer; and forming a gate structure on the active patterns.

BRIEF DESCRIPTION OF THE DRAWINGS

Features will be apparent to those of skill in the art by describing in detail exemplary embodiments with reference to the attached drawings in which.

DETAILED DESCRIPTION

Figure 1A:
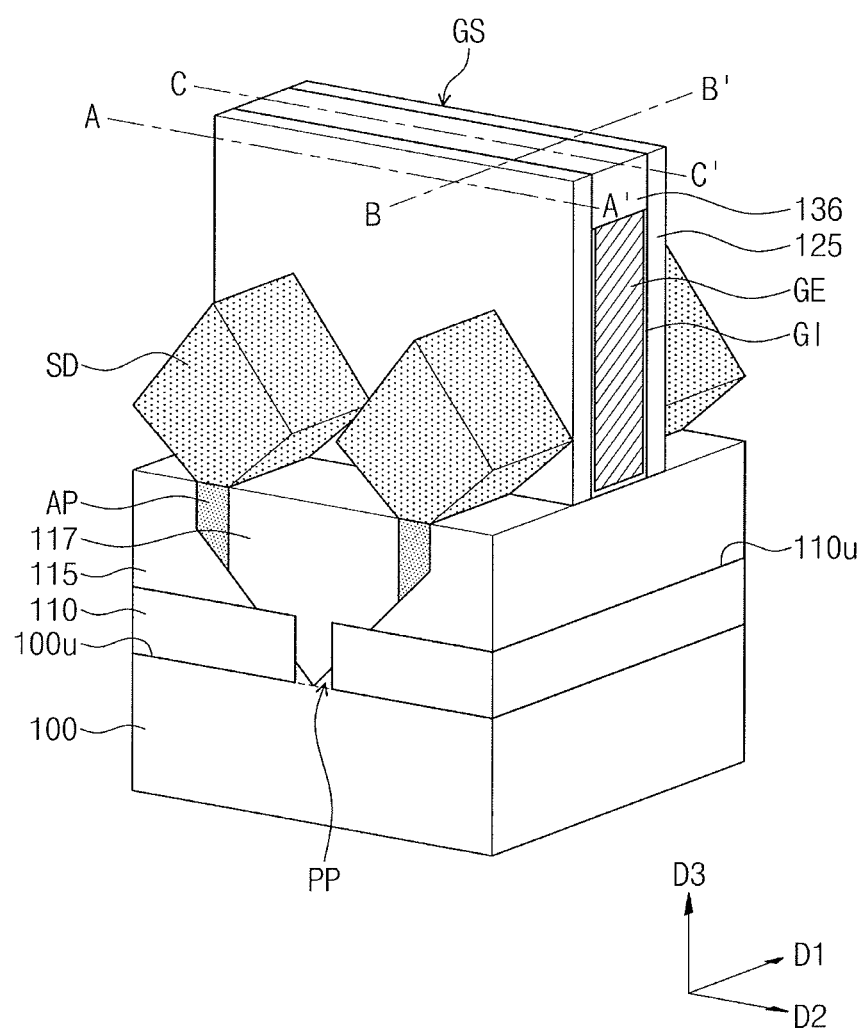
FIG. 1A illustrates a perspective view of a semiconductor device according to example embodiments.
Figure 1B:
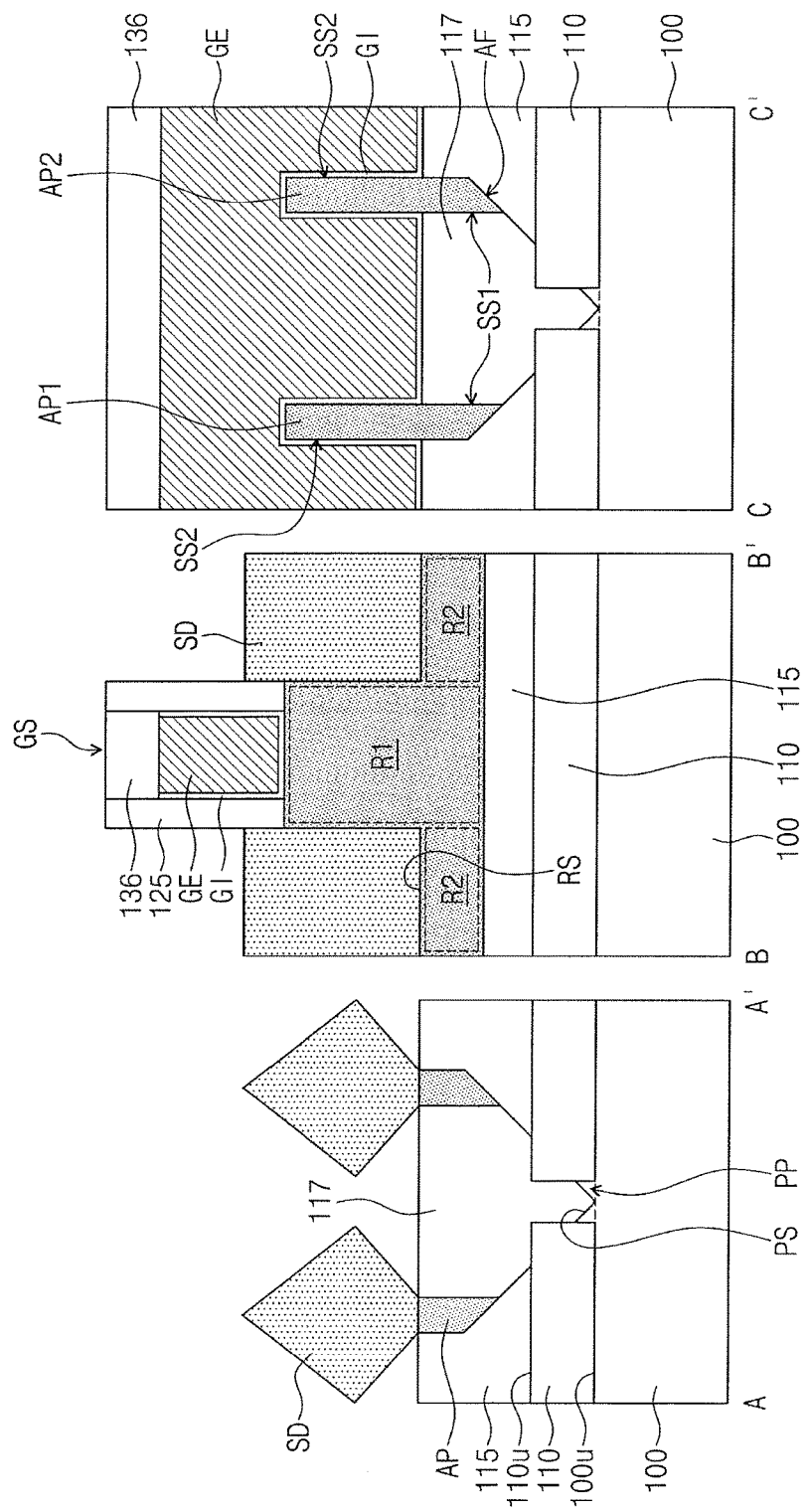
FIG. 1B illustrates a cross-sectional view taken along lines A-A', B-B', and C-C' of FIG. 1A.
Figure 2:
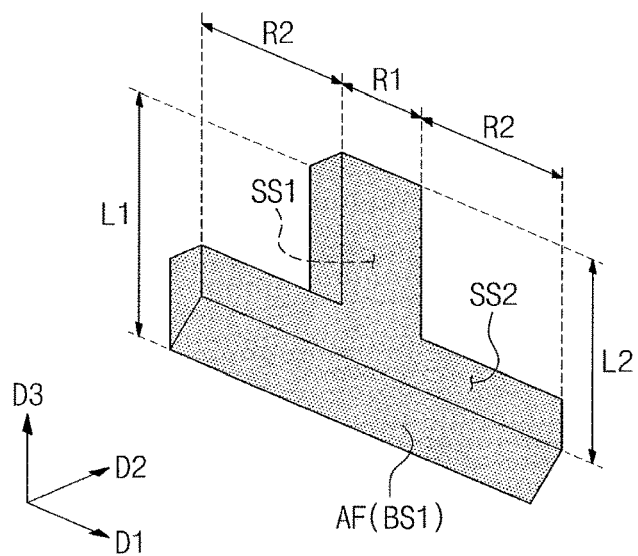
FIGS. 2 and 3 illustrate perspective views of an active pattern according to example embodiments.
Figure 3:
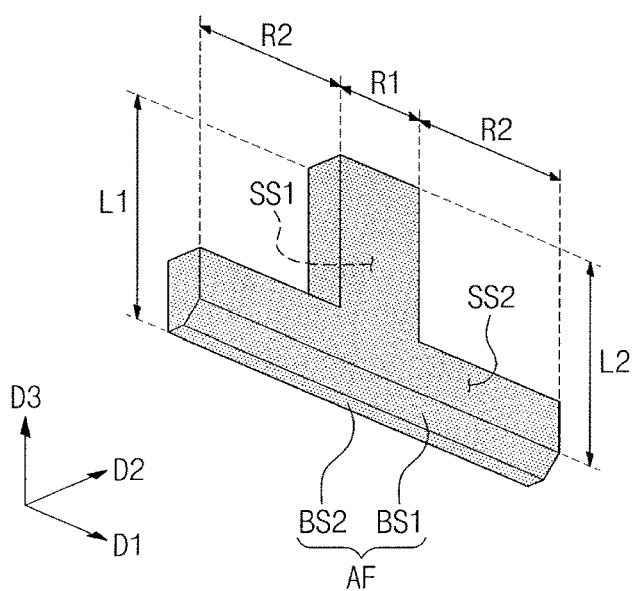

FIG. 1A illustrates a perspective view of a semiconductor device according to example embodiments. FIG. 1B illustrates a cross-sectional view taken along lines A-A', B-B', and C-C' of FIG. 1A. FIGS. 2 and 3 illustrate perspective views of an active pattern according to example embodiments.

Referring to FIGS. 1A and 1B, isolation patterns 110 may be disposed on a substrate 100. The substrate 100 may be a semiconductor substrate. For example, the substrate 100 may be silicon substrate. An upper surface 100u of the substrate 100 may be a (100) surface. The isolation patterns 110 may extend (e.g., lengthwise) in a first direction D1 parallel to the upper surface 100u of the substrate 100. The isolation patterns 110 may include, e.g., an oxide, a nitride, and/or an oxynitride. The isolation patterns 110 may expose the substrate 100.

The substrate 100 may include a protrusion portion PP protruding from the upper surface 100u thereof and between facing sidewalls of the isolation patterns 110. An upper surface PS of the protrusion portion PP may be lower than (e.g., closer to the substrate 100 than) upper surfaces 110u of the isolation patterns 110, relative to the upper surface 100u of the substrate 100.

The protrusion portion PP may extend in the first direction D1. In plan view, the protrusion portion PP may extend in the first direction D1 between a pair of active patterns AP to be described below. The protrusion portion PP may have the upper surface PS which is sloped relative to the upper surface 100u of the substrate 100. The upper surface PS of the protrusion portion PP may extend in the first direction D1. The protrusion portion PP may have a V-shaped cross-section.

A first interlayer insulating layer 115 and a second interlayer insulating layer 117 may be disposed on the substrate 100 to cover the isolation patterns 110. In an implementation, the first and second interlayer insulating layers 115 and 117 may include a same material. For example, the first and second interlayer insulating layers 115 and 117 may each include a silicon oxide layer. In an implementation, the first and second interlayer insulating layers 115 and 117 may include different materials.

Active patterns AP may be disposed on the substrate 100. The active patterns AP may each include a lower portion buried in (or extending into) the first and second interlayer insulating layers 115 and 117 and an upper portion protruding above the first and second interlayer insulating layers 115 and 117 (e.g., away from the substrate 100). A plurality of active patterns AP may be disposed on the isolation patterns 110 and may be spaced apart from each other in a second direction D2 (crossing the first direction D1) and parallel to the upper surface 100u of the substrate 100. Hereinafter, it will be mainly described with respect to a pair of active patterns AP. The active patterns AP may each extend in the first direction D1. The active patterns AP may each have, e.g., a fin shape or a plate shape. The active patterns AP may be spaced apart from the upper surface 110u of the isolation patterns 110.

The active patterns AP may each have a lower surface AF that extends in the first direction D1 and is sloped or inclined relative to the upper surface 100u of the substrate 100. Referring to FIGS. 2 and 3, the lower surface AF of each active pattern AP may include a first lower surface BS1. For example, the first lower surface BS1 may extend in the first direction D1 and have a first slope angle relative to the upper surface 100u of the substrate 100. In an implementation, the first slop angle may be, e.g., about 45° to about 65°.

The first lower surface BS1 may be a surface perpendicular to a preferred orientation of each active pattern AP. For example, the preferred orientation of each active pattern AP may be a [111] orientation. The first lower surface BS1 may be a (111) surface. The first lower surface BS1 may be a close packed surface.

In an implementation, as illustrated in FIG. 3, the lower surface AF each active pattern AP may further include a second lower surface BS2 that is connected to or continuous with the first lower surface BS1 and has a second slope angle smaller than the first slope angle. In an implementation, the second lower surface BS2 may be parallel to the first lower surface BS1. In an implementation, the second lower surface BS2 may be substantially parallel to the upper surface 100u of the substrate 100. In an implementation, the second lower surface BS2 may be a (100) surface.

Each active pattern AP may have opposite first and second side surfaces SS1 and SS2. The first and second side surfaces SS1 and SS2 may each be a surface parallel to the first direction D1. The first side surface SS1 may have a first length (or height, e.g., from the substrate 100) L1 in a third direction D3 perpendicular to the upper surface 100u of the substrate 100. The second surface SS2 may have a second length (or height) L2 that is less than the first length L1 in the third direction D3. In an implementation, the second length L2 may be about 5% to 20% shorter than the first length L1.

The active patterns AP may each include a first region R1 covered by a gate structure GS and second regions R2 having upper surfaces that are lower than an upper surface of the first region R1 relative to the upper surface 100u of the substrate 100. The upper surfaces of the second regions R2 may be bottom surfaces of recess regions RS, that are recessed from the upper surface of the first region R1.

The first side surfaces SS1 of the pair of active patterns AP may face each other in the second direction D2. For example, the first side surfaces SS1 of the pair of active patterns AP may be between the second side surfaces SS2 thereof in the second direction D2.

The active patterns AP may include a first active pattern AP1 and a second active pattern AP2 that are opposite to each other. The first active pattern AP1 may have the first side surface SS1 facing in the second direction D2 and the second side surface SS2 facing in a reverse direction thereto. The second active pattern AP2 may have the second side surface SS2 facing in the second direction D2 and the first side surface SS1 facing in the reverse direction thereto. The first active pattern AP1 and the second active pattern AP2 may be arranged in mirror symmetry relative to a vertical plane with respect to the upper surface 100u of the substrate 100 (e.g., relative to a plane orthogonal to the upper surface 100u of the substrate 100 and equidistant from each of the active patterns). In an implementation, the active patterns AP may include a plurality of first active patterns AP1 and a plurality of second active patterns AP2. The first active patterns AP1 and the second active patterns AP2 may be alternately arranged in the second direction D2. In plan view, the protrusion portion PP may be disposed between the respective first active patterns AP1 and the respective second active patterns AP2.

The active patterns AP may include a different material from the substrate 100. In an implementation, the active patterns AP may include, e.g., InGaAs, InAs, InSb, and/or InGaSb. In an implementation, the active patterns AP may include, e.g., Si, Ge, SiGe, SiSn, GeSn, GeC, SnC and/or SiC.

The gate structure GS may be disposed on the active patterns AP and extend in the second direction D2. The gate structure GS may cross the active patterns AP. The gate structure GS may include a gate electrode GE and a gate insulating pattern GI. The gate insulating pattern GI may be interposed between the gate electrode GE and the active patterns AP and extend between the gate electrode GE and the first and second interlayer insulating layers 115 and 117. The gate electrode GE and the gate insulating pattern GI may extend in the second direction D2. Gate spacers 125 may be disposed on opposite sidewalls of the gate structure GS. The gate insulating pattern GI may extend between the gate electrode GE and the gate spacers 125. A gate capping pattern 136 may be disposed on the gate structure GS. The gate spacers 125 and the gate capping pattern 136 may extend in the second direction D2 along the gate electrode GE.

The gate electrode GE may include conductive metal nitride, e.g., titanium nitride or tantalum nitride, and/or metal, e.g., aluminum or tungsten. The gate insulating pattern GI may include a high-k dielectric material. In an implementation, the gate insulating pattern GI may include, e.g., hafnium oxide, hafnium silicate, zirconium oxide, and/or zirconium silicate. The gate spacers 125 may include a nitride, e.g., silicon nitride. The gate capping pattern 136 may include, e.g., silicon oxide.

Source/drain regions SD may be disposed at opposite sides of the gate structure GS. The source/drain regions SD may be disposed on the second regions R2 of the active patterns AP. The source/drain regions SD may be laterally spaced from each other with the first region R1 therebetween. Lower surfaces of the source/drain regions SD may be lower than the upper surface of the first region R1 relative to the upper surface 100u of the substrate 100.

The source/drain regions SD may each include an epitaxial layer grown using the respective active patterns AP as a seed. The source/drain regions SD may include, e.g., silicon germanium (SiGe), silicon (Si), and/or silicon carbide (SiC). In an implementation, when a semiconductor device according to an embodiment is a complementary metal oxide field effect transistor (CMOSFET), a first epitaxial layer may be formed to form the source/drain regions SD of an n-type MOSFET (NMOSFET) and a second epitaxial layer may be formed to form the source/drain regions SD of a p-type MOSFEF (PMOSFET). The first epitaxial layer may apply tensile strain to a channel region (e.g., each active pattern AP) of the NMOSFET. The second epitaxial layer may apply compressive strain to a channel region (e.g., each active pattern AP) of the PMOSFET. In an implementation, the first epitaxial layer may include, e.g., Si and/or SiC. In an implementation, the second epitaxial layer may include, e.g., SiGe.

The source/drain regions SD may further include impurities. In the NMOSFET, the impurities in the source/drain regions SD may be, e.g., phosphorous (P). In the PMOSFET, the impurities in the source/drain regions SD may be, e.g., boron (B).

FIGS. 4A, 5A, 6A, 7A, 8A, 9A, 10A, and 11A illustrate perspective views of stages in a method of fabricating a semiconductor device according to example embodiments. FIGS. 4B, 5B, 6B, 7B, 8B, and 9B illustrate cross-sectional views taken along lines A-A' and D-D' of FIGS. 4A, 5A, 6A, 7A, 8A, 9A, respectively. FIGS. 10B and 11B illustrate cross-sectional views taken along lines A-A', B-B', and C-C' of FIGS. 10A and 11A, respectively.

Figure 4A:
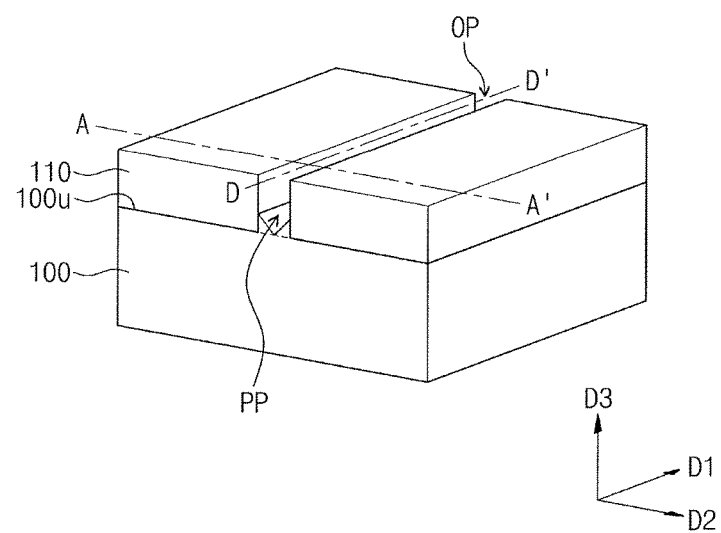
FIGS. 4A, 5A, 6A, 7A, 8A, 9A, 10A, and 11A illustrate perspective views of stages in a method of fabricating a semiconductor device according to example embodiments.
Figure 4B:
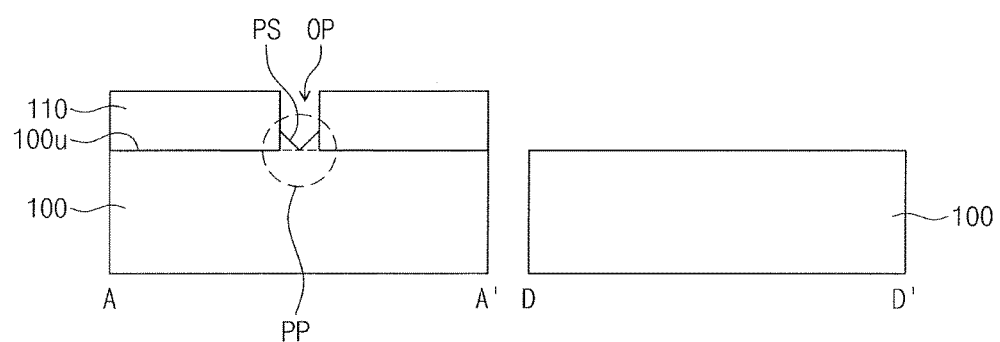
FIGS. 4B, 5B, 6B, 7B, 8B, and 9B illustrate cross-sectional views taken along lines A-A' and D-D' of FIGS. 4A, 5A, 6A, 7A, 8A, 9A, respectively.

Referring to FIGS. 4A and 4B, the isolation patterns 110 may be formed on the substrate 100. The isolation patterns 110 may be formed by etching an upper portion of the substrate 100 to form trenches and then forming an insulating layer to fill the trenches and planarizing the insulating layer. The isolation patterns 110 may include, e.g., an oxide, a nitride, and/or an oxynitride. The isolation patterns 110 may each extend in the first direction D1 and expose a portion of the substrate 100. In an implementation, the isolation patterns 110 may be spaced apart from each other. In an implementation, the isolation patterns 110 may be connected to each other.

The exposed portion of the substrate 100 between the isolation patterns 110 may be etched to form an opening OP between the isolation patterns 110. The opening OP may have a linear shape extending in the first direction D1. The opening OP may be formed by, e.g., a wet etch process. Thus, the protrusion portion PP may be formed under or in the opening OP. The protrusion portion PP may be formed between the isolation patterns 110 and may protrude above lower surfaces of the isolation patterns 110.

The protrusion portion PP may cover lower portions of the isolation patterns 110. An uppermost surface of the protrusion portion PP may be lower than uppermost surfaces of the isolation patterns 110 relative to the upper surface 100u of the substrate 100. The protrusion portion PP may have the sloped upper surface PS. The protrusion portion PP may have a V-shaped cross-section. A slope angle between the upper surface PS of the protrusion portion PP and the upper surface 100u of the substrate 100 may be, e.g., about 45° to about 65°.

The aforementioned wet etch process may be performed to have an orientation based on a crystallographic characteristic of the substrate 100. For example, the wet etch process may be performed to expose a closed packed surface of the substrate 100. In an implementation, the upper surface PS of the protrusion portion PP may be, e.g., a (111) surface. In an implementation, the protrusion portion PP may be formed by an epitaxial growth. For example, the protrusion portion PP may be formed by being grown from the upper surface 100u of the substrate 100. In this case, a shape of the protrusion portion PP may be different from that shown FIGS. 4A and 4B.

Figure 5A:
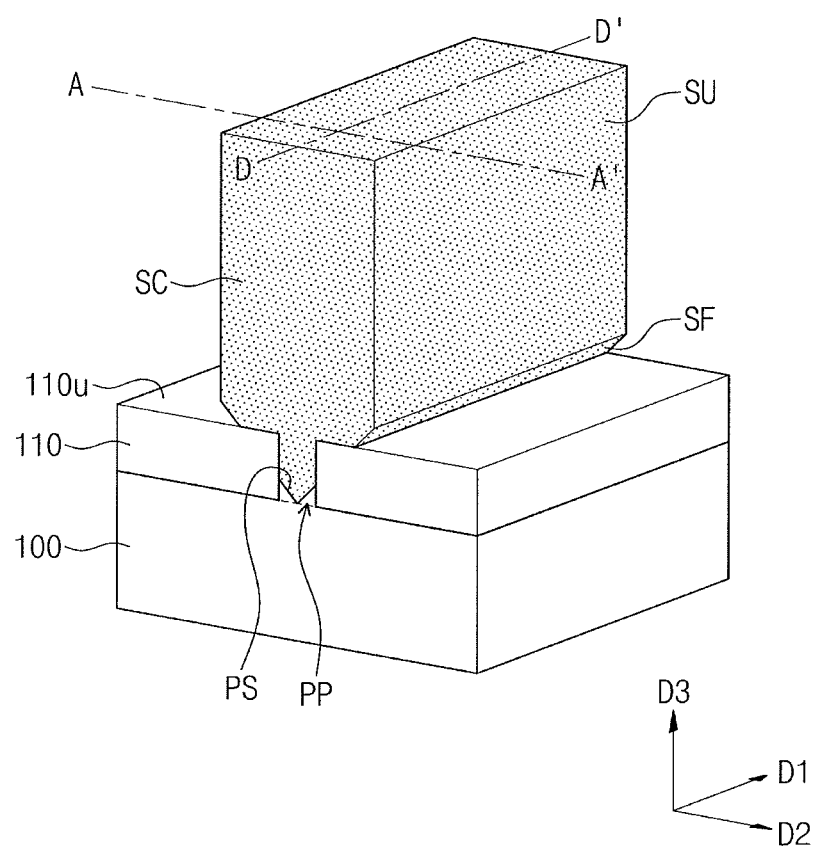
Figure 5B:
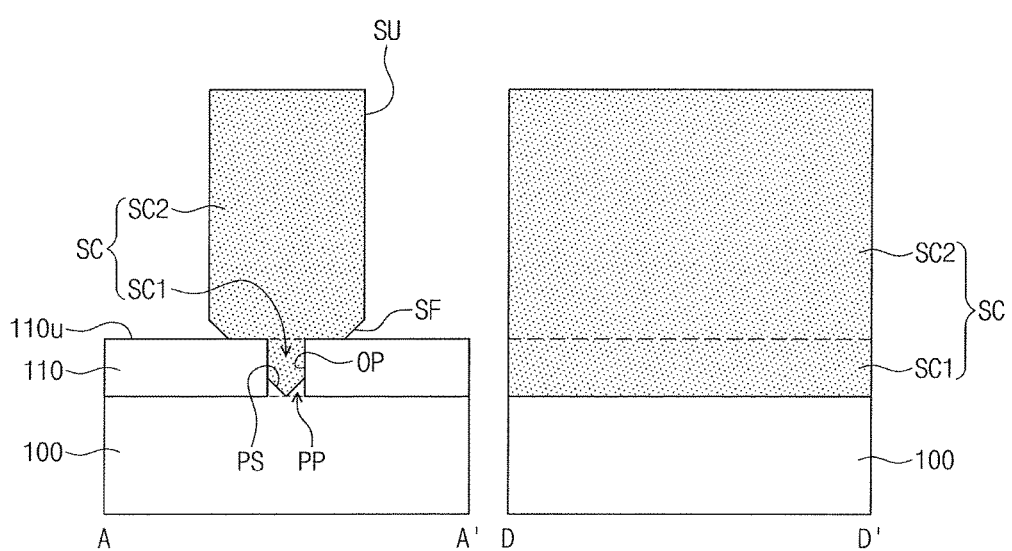

Referring to FIGS. 5A and 5B, a sacrificial semiconductor layer SC may be formed by being grown using the protrusion portion PP as a seed. The sacrificial semiconductor layer SC may be formed by an epitaxial growth process. The epitaxial growth process may include a chemical vapor deposition (CVD) process or a molecular beam epitaxy (MBE) process.

The sacrificial semiconductor layer SC may include the same material as the substrate 100. For example, the sacrificial semiconductor layer SC may be a silicon layer. In an implementation, the sacrificial semiconductor layer SC may include a semiconductor material different from the substrate 100. For example, the sacrificial semiconductor layer SC may be a semiconductor layer including a group IV element, such as SiGe or Ge. The sacrificial semiconductor layer SC may include a semiconductor compound, e.g., a group III-V semiconductor, such as GaAs or InP.

The sacrificial semiconductor layer SC may include a first portion SC1 in the opening OP and a second portion above or on upper surfaces 110u of the isolation patterns 110. The first portion SC1 may be grown from the upper surface PS of the protrusion portion PP in the third direction D3 to fill the opening OP. Crystal defects of the sacrificial semiconductor layer SC may not spread above the upper surfaces 110u of the isolation patterns 110, but may be trapped in the opening OP.

The second portion SC2 grown above the upper surfaces 110u of the isolation patterns 110 may have a crystallographic orientation. In an implementation, a lower side surface SF of the second portion SC2 adjacent to or in contact with the upper surfaces 110u of the isolation patterns 110 may extend in the first direction D1 and be sloped relative to the upper surface 100u of the substrate 100. A slope angle between the lower side surface SF of the second portion SC2 and the upper surface 100u of the substrate 100 may be, e.g., about 45° to about 65°.

The lower side surface SF of the second portion SC2 may be a surface perpendicular to a preferred orientation of the sacrificial semiconductor layer SC. The preferred orientation of the sacrificial semiconductor layer SC may be a [111] orientation. The lower side surface SF of the second portion SC2 may be a (111) surface. The lower side surface SF of the second portion SC2 may be a close packed surface.

An upper side surface SU of the second portion SC2 may extend from the lower side surface SF thereof and be a surface having a normal line in the second direction D2 or in the reverse direction thereto. The upper side surface SU of the second portion SC2 may be substantially perpendicular to the upper surfaces 110u of the isolation patterns 110. In an implementation, the upper side surface SU of the second portion SC2 may be a (110) surface.

A ratio of a dimension of the lower side surface SF to a dimension of the upper side surface SU may be determined by adjusting a vertical epitaxial growth rate (in the third direction D3) and a horizontal epitaxial growth rate (in the first and/or second directions D1 and/or D3). For example, the lower side surface SF of the second portion SC2 may be formed at an increasing vertical epitaxial growth rate by adjusting an epitaxial process condition, e.g., at least one of temperature, pressure, and gas flow. In an implementation, the ratio of the dimension of the lower side surface SF in the second portion SC2 may increase as the process temperature is higher and the process pressure is lower.

Figure 6A:
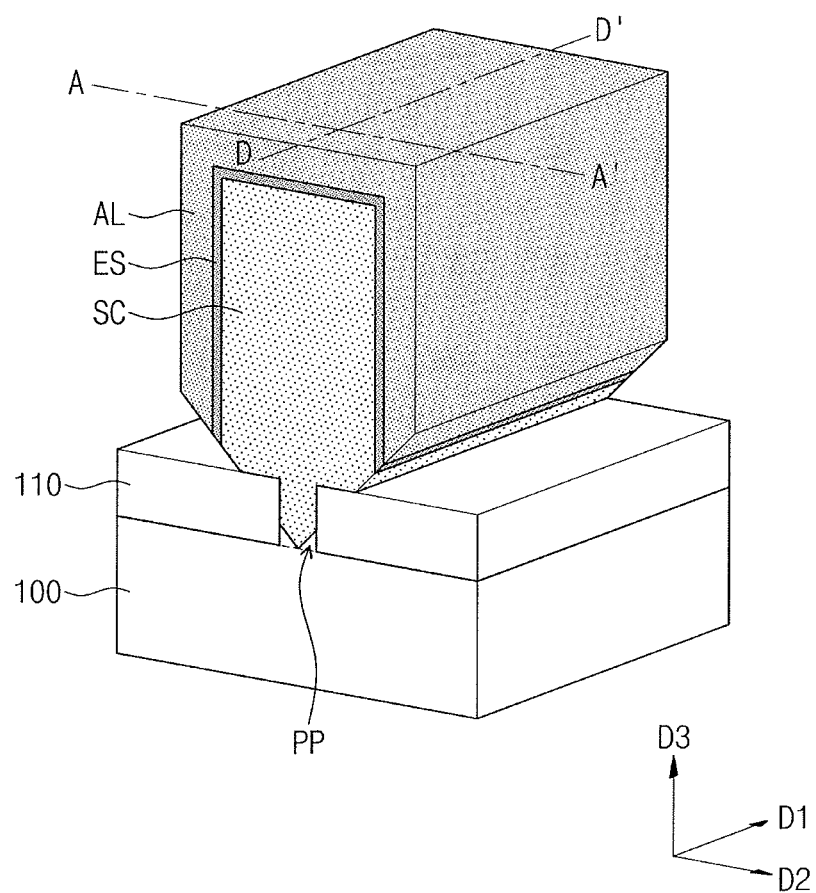
Figure 6B:
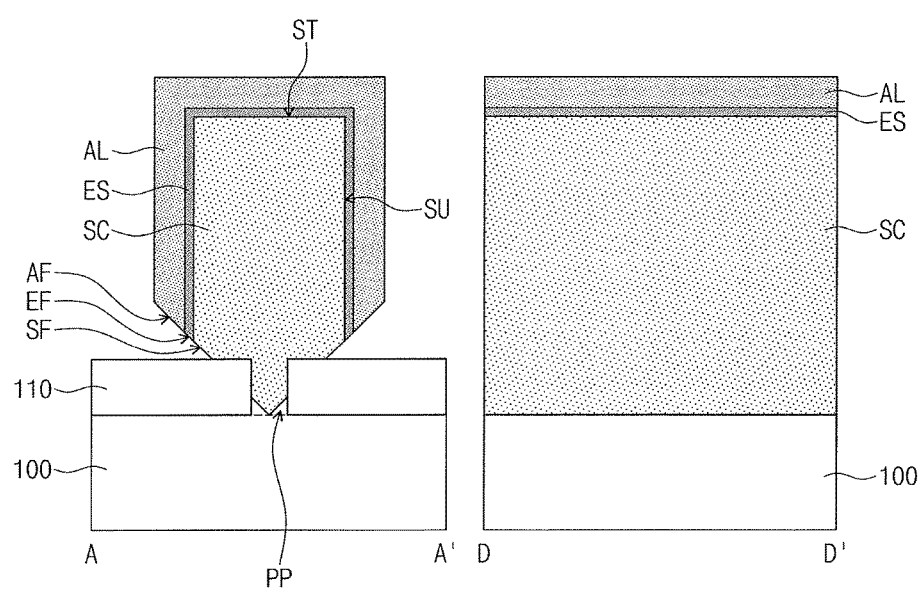

Referring to FIGS. 6A and 6B, an etch stop layer ES and an active layer AL may be sequentially grown on the sacrificial semiconductor layer SC. The etch stop layer ES may include a material having an etch selectivity to the sacrificial semiconductor layer SC and/or the active layer AL. In an implementation, when the sacrificial semiconductor layer SC is a GaAs layer, the etch stop layer ES may be an InGaP or InP layer and the active layer AL may be an InGaAs layer. In an implementation, when the sacrificial semiconductor layer SC is a GsAs layer and the etch stop layer ES is an InGaP or InP layer, the active layer AL may be an InAs, InSb, or InGaSb layer. In an implementation, the sacrificial semiconductor layer SC, the etch stop layer ES, and the active layer AL may be different layers selected from a Si, Ge, SiGe, SiSn, GeSn, GeC, SnC, and SiC layer.

The sacrificial semiconductor layer SC, the etch top layer ES, and the active layer AL may be continuously gown in the same process chamber (i.e., in-situ). The etch stop layer ES and the active layer AL may be formed along the upper side surface SU and an upper surface ST of the sacrificial semiconductor layer SC. The etch stop layer ES and the active layer AL may cover the upper side surface SU and the upper surface ST of the sacrificial semiconductor layer SC, but not cover the lower side surface SF thereof. A lower surface EF of the etch stop layer ES and a lower surface AF of the active layer AL may be substantially parallel to or coplanar with the lower side surface SF of the sacrificial semiconductor layer SC. For example, a slope angle between each of the lower surfaces EF and AF of the etch stop layer ES and the active layer AL and the upper surface 110u of each of the isolation patterns 110 may be, e.g., about 45° to about 65°. The lower surfaces EF and AF of the etch stop layer ES and the active layer AL may be (111) surfaces. The lower surfaces EF and AF of the etch stop layer ES and the active layer AL may be close packed surfaces.

Figure 7A:
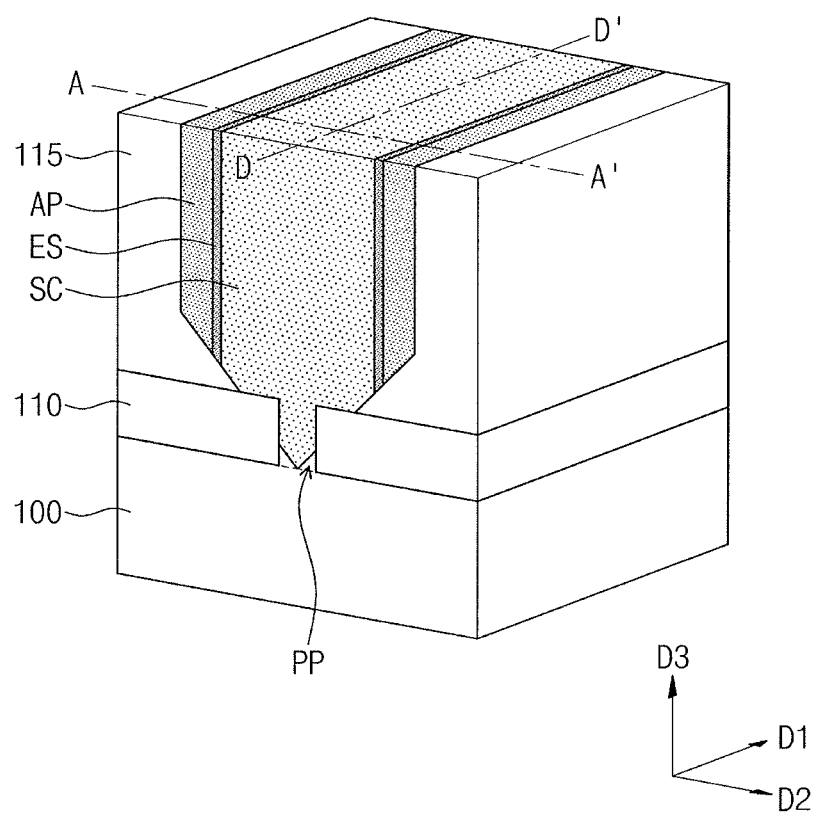
Figure 7B:
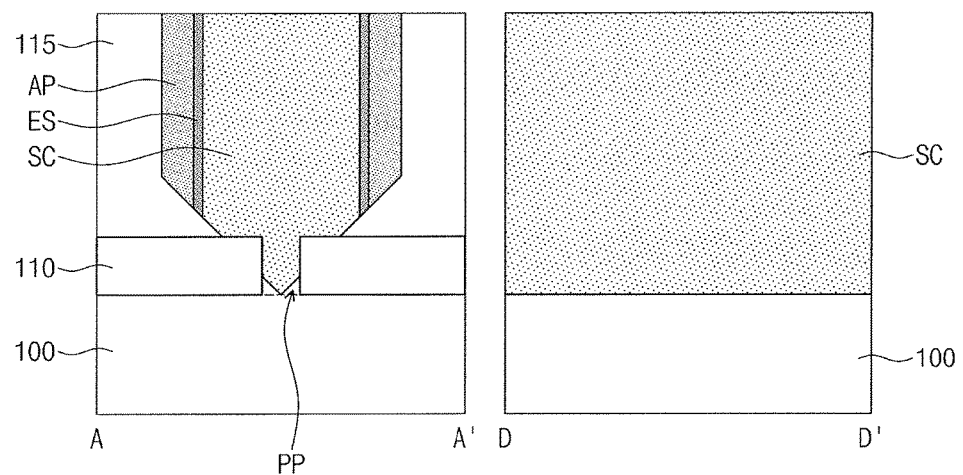

Referring to FIGS. 7A and 7B, after forming the first interlayer insulating layer 115 to cover the active layer AL, a planarization process may be performed until the upper surface ST of the sacrificial semiconductor layer SC is exposed. The planarization process may include a chemical mechanical polishing process. The first interlayer insulating layer 115 may include, e.g., silicon oxide, silicon nitride, and/or silicon oxynitride. By the planarization process, the etch stop layer ES and the active layer AL may each be separated into a pair of spaced patterns with the sacrificial semiconductor layer SC therebetween. As the active layer AL is separated, the active patterns AP may be formed. The active patterns AP may each have a fin or plate shape.

Figure 8A:
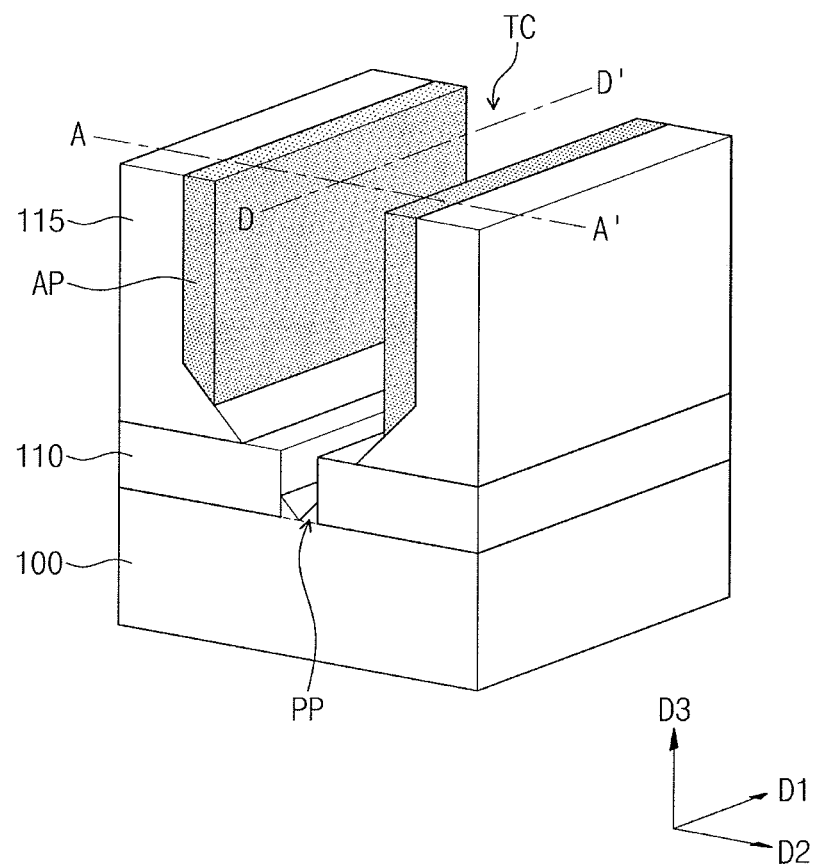
Figure 8B:
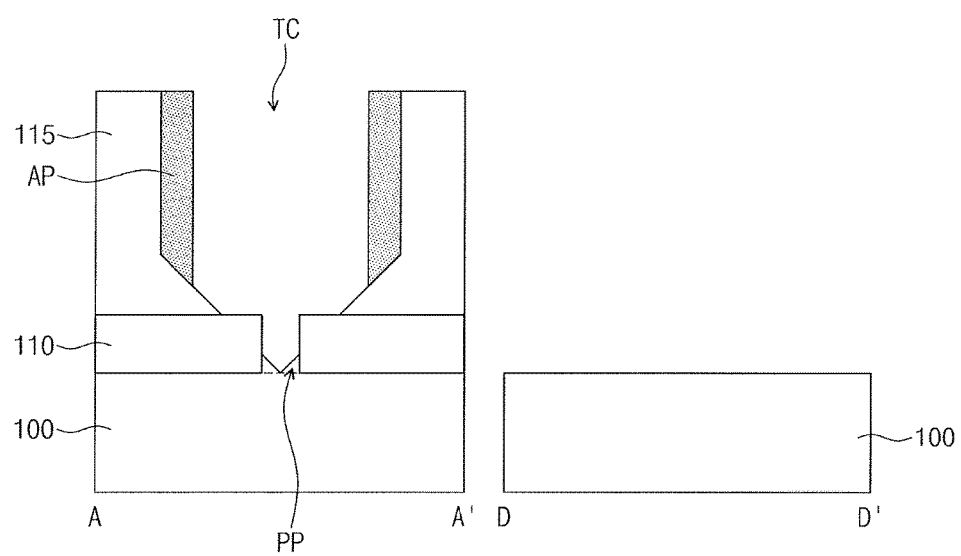

Referring to FIGS. 8A and 8B, the sacrificial semiconductor layer SC and the etch stop layer ES may be sequentially removed. The sacrificial semiconductor layer SC and the etch stop layer ES may be removed using different etch recipes. In an implementation, when the sacrificial semiconductor layer SC is a GaAs layer, the sacrificial semiconductor layer SC may be etched using an etchant including sulfuric acid and/or citric acid. In an implementation, when the etch stop layer ES is an InGaP layer, the etch stop layer ES may be etched using an etchant including hydrochloric acid. In an implementation, a portion of the active patterns AP may be etched during the removal of the sacrificial semiconductor layer SC and the etch stop layer ES.

By the removal of the sacrificial semiconductor layer SC and the etch stop layer ES, a trench TC may be formed between the active patterns AP. The trench TC may expose the substrate 100, e.g., the protrusion portion PP.

Figure 9A:
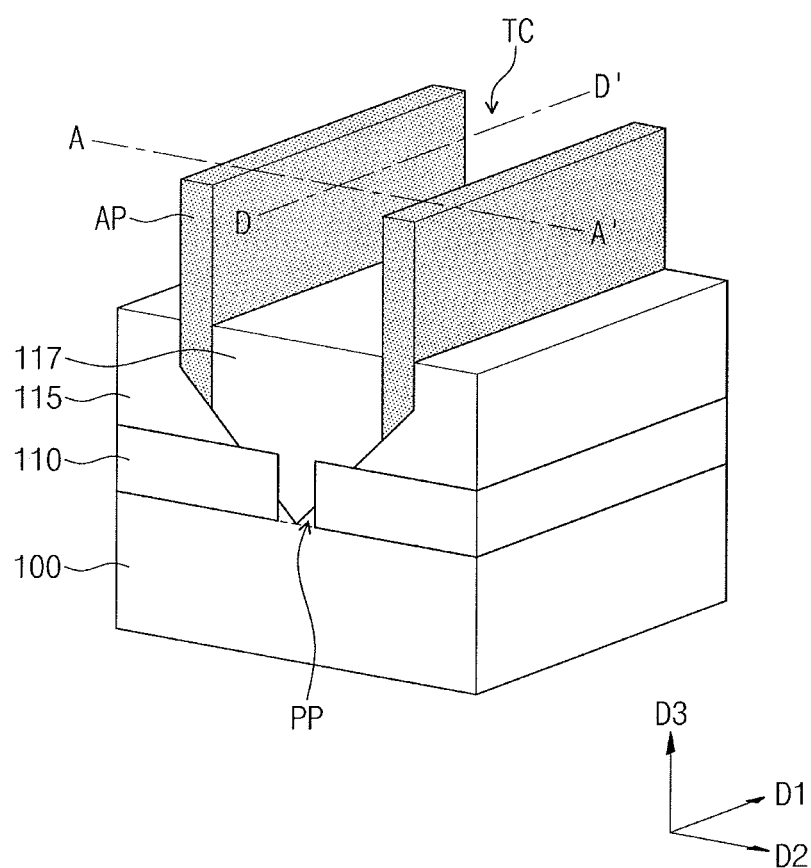
Figure 9B:
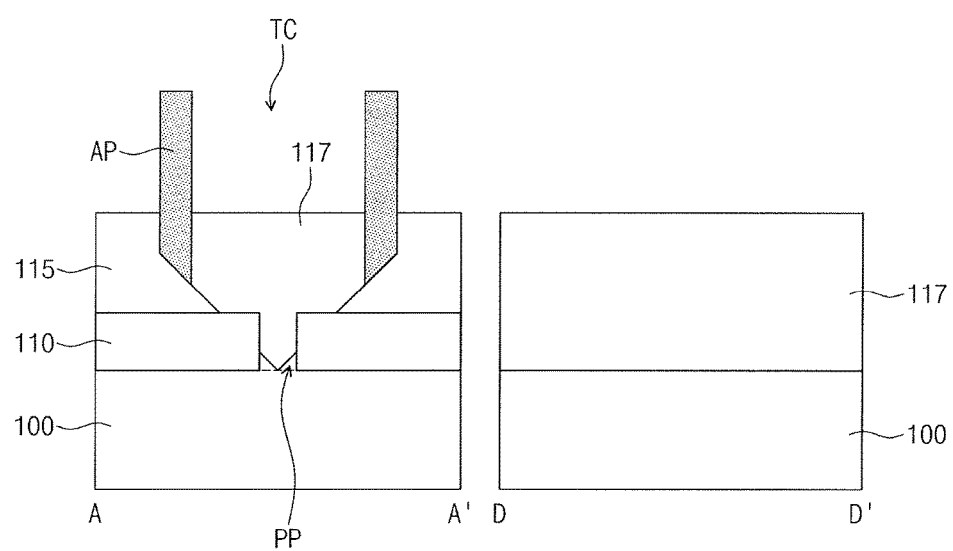

Referring to FIGS. 9A and 9B, the second interlayer insulating layer 117 may be formed in the trench TC. In an implementation, the second interlayer insulating layer 117 may include, e.g., the same material as the first interlayer insulating layer 115. In an implementation, the second interlayer insulating layer 117 may include, e.g., silicon oxide, silicon nitride, and/or silicon oxynitride. The second interlayer insulating layer 117 may be formed by a CVD process.

Upper portions of the first and second interlayer insulating layers 115 and 117 may be removed to expose upper portions of the active patterns AP. For example, the upper portions of the first and second interlayer insulating layers 115 and 117 may be selectively removed using an etchant including phosphoric acid. Lower portions of the active patterns AP may be buried in the first and second interlayer insulating layers 115 and 117. The first and second interlayer insulating layers 115 and 117 may support the active patterns AP not to collapse. For example, a length (or height) in the third direction D3, of the lower portion of each active patter AP which is buried in the first and second interlayer insulating layers 115 and 117 may be about 20% to 50% of a length (or height) of each active pattern AP in the third direction.

Figure 10A:
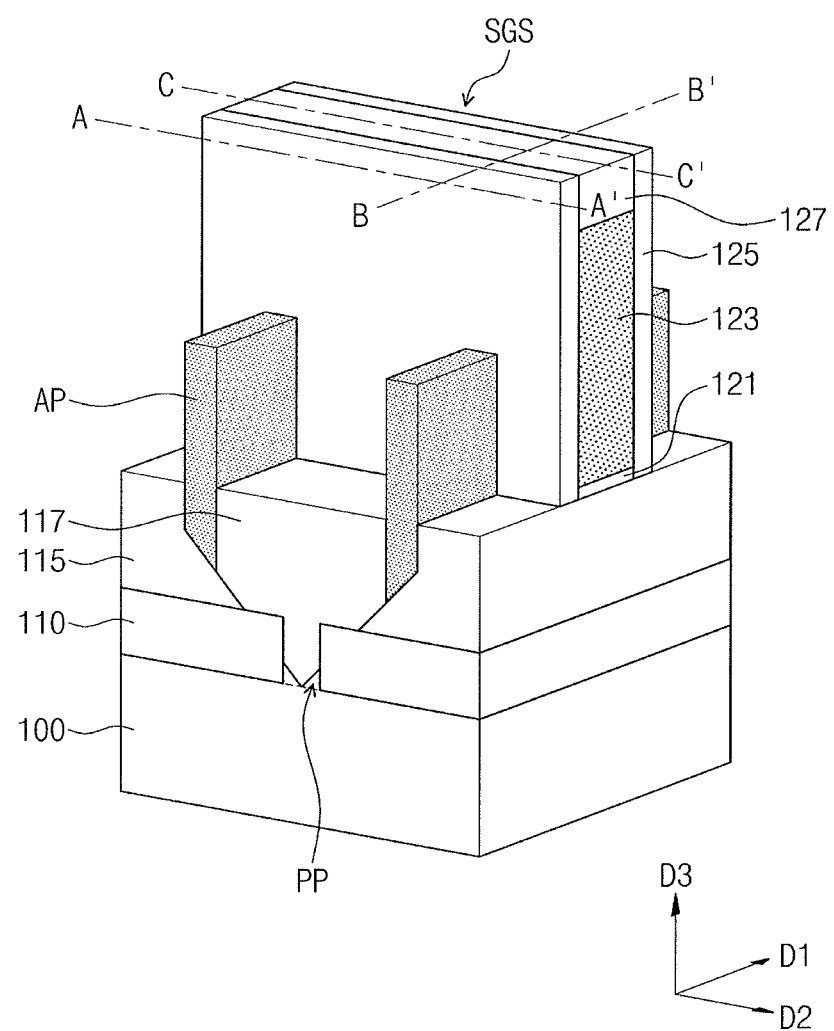
Figure 10B:
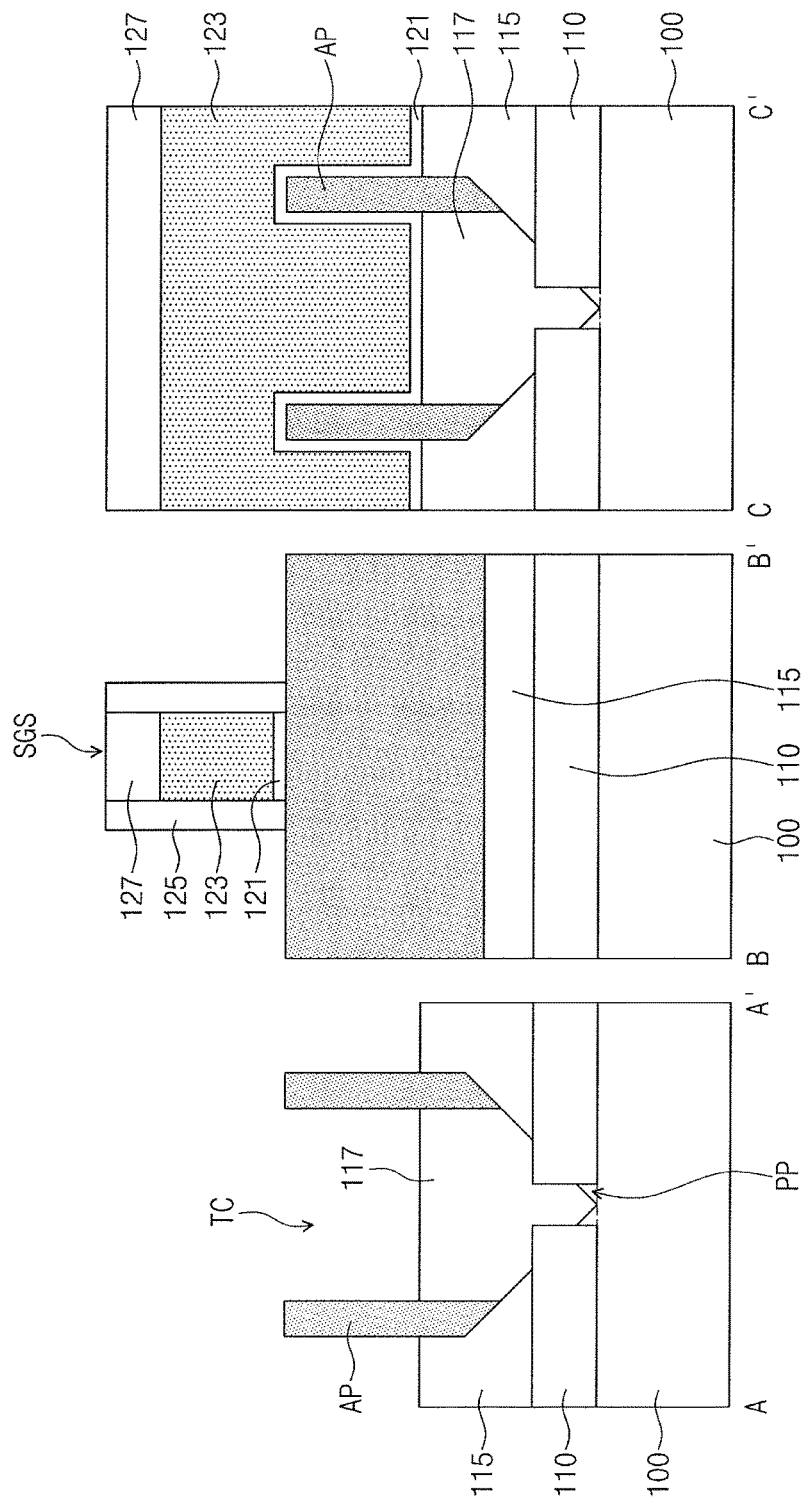
FIGS. 10B and 11B illustrate cross-sectional views taken along lines A-A', B-B', and C-C' of FIGS. 10A and 11A, respectively.

Referring to FIGS. 10A and 10B, a sacrificial gate structure SGS may be formed on the active patterns AP. The sacrificial gate structure SGS may extend in the second direction D2 across the active patterns AP. The sacrificial gate structure SGS may include a sacrificial gate pattern 123, an etch stop pattern 121, the gate spacers 125, and a sacrificial capping pattern 127.

The sacrificial gate pattern 123 may extend in the second direction D2. The sacrificial gate pattern 123 may cover an upper surface and side surfaces of the active patterns AP and extend onto upper surfaces of the first and second interlayer insulating layers 115 and 117. The etch stop pattern 121 may extend along a lower surface of the sacrificial gate pattern 123. The etch stop pattern 121 may extend between the active patterns AP and the sacrificial gate pattern 123 and between the sacrificial gate pattern 123 and the first and second interlayer insulating layers 115 and 117.

The sacrificial gate pattern 123 and the etch stop pattern 121 may be formed by sequentially forming an etch stop layer and a sacrificial gate layer on the first and second interlayer insulating layers 115 and 117 to cover the active patterns AP and sequentially patterning the sacrificial gate layer and the etch stop layer. The etch stop layer may include, e.g., silicon oxide. The sacrificial gate layer may include a material having an etch selectivity to the etch stop layer, for example, polysilicon.

The sacrificial gate layer may be patterned by an etch process using an etch condition having an etch selectivity to the etch stop layer to form the sacrificial gate pattern 123. After forming the sacrificial gate pattern 123, the etch stop layer at opposite sides of the sacrificial gate pattern 123 may be removed to form the etch stop pattern 121 under the sacrificial gate pattern 123. The sacrificial capping pattern 127 may be used as a mask pattern for forming the sacrificial gate pattern 123. The sacrificial capping pattern 127 may include, e.g., silicon oxide.

The gate spacers 125 may be formed on opposite sidewalls of the sacrificial gate pattern 123. The gate spacers 125 may be formed by forming an insulating layer to cover the sacrificial gate pattern 123 and performing an anisotropic etch process on the insulating layer. The gate spacers 125 may include, e.g., silicon nitride and/or silicon oxynitride.

Figure 11A:
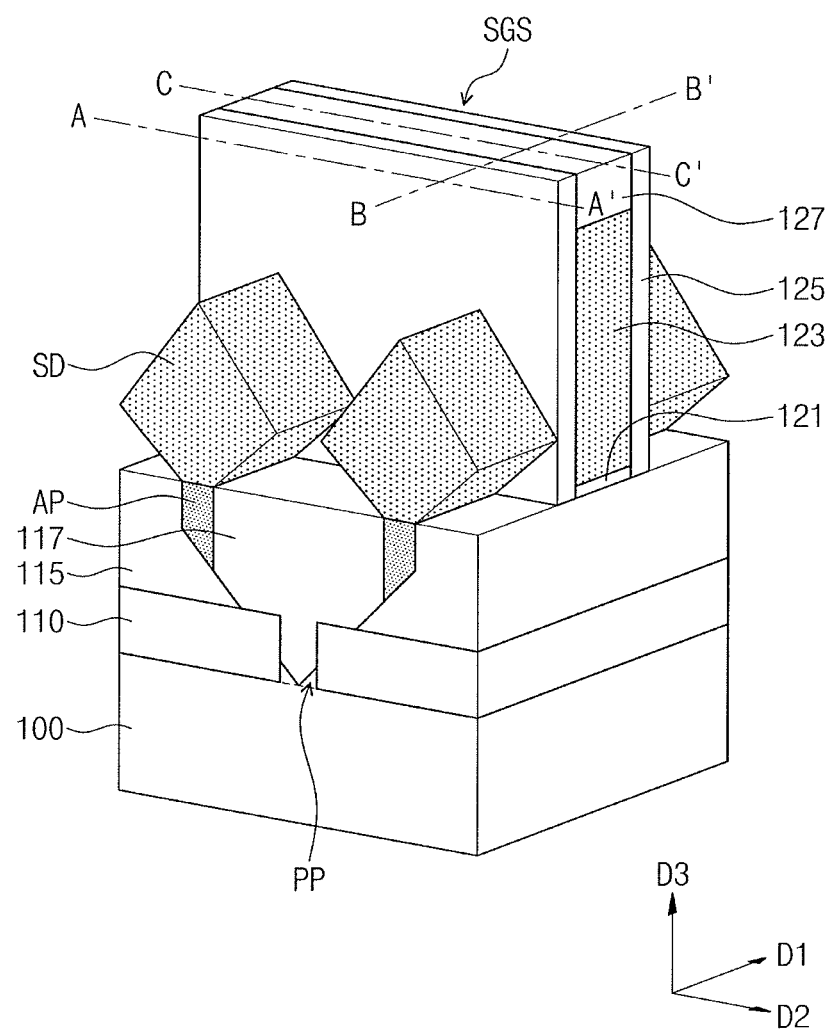
Figure 11B:
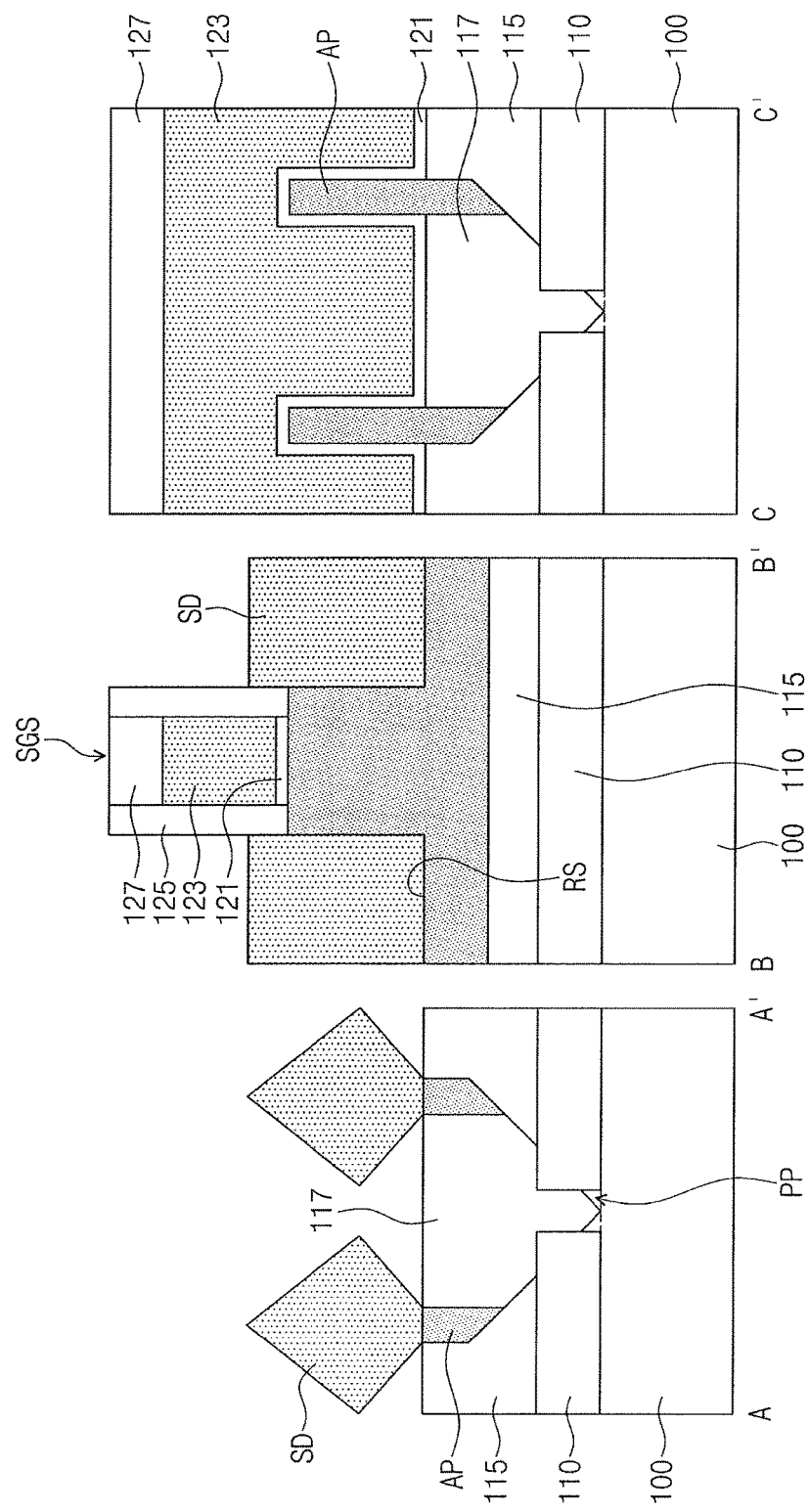

Referring to FIGS. 11A and 11B, the source/drain regions SD may be formed at opposite sides of the sacrificial gate structure SGS. The formation of the source/drain regions SD may include removing the upper portions of the active patterns AP exposed by the sacrificial gate structure SGS to form the recess regions RS. A selective epitaxial growth process may be performed using upper surfaces of the active patterns AP exposed by the recess regions RS as a seed to grow epitaxial layers serving as the source/drain regions SD. The source/drain regions SD may each include, e.g., Si, SiGe, and/or SiC. The source/drain regions SD may be formed of a material having a greater or smaller lattice constant than the active patterns AP, to apply compressive or tensile strain to the active patterns AP. In an implementation, the source/drains SD may have, e.g., a pentagonal cross-section as shown in FIG. 11B.

The formation of the source/drain regions SD may further include doping impurities into the source/drain regions SD during or after the selective epitaxial growth process. The impurities may enhance an electrical characteristic of a transistor including the source/drain regions SD. When the transistor is an NMOSFET, the impurities may be, e.g., phosphorus. When the transistor is a PMOSFET, the impurities may be, e.g., boron.

Referring again to FIGS. 1A and 1B, after removing the sacrificial capping pattern 127, the sacrificial gate pattern 123, and the etch stop pattern 121 to form a gap region between the gate spacers 125, the gate insulating pattern GI, the gate electrode GE, and the gate capping pattern 136 may be formed in the gap region. The gap region may be formed by forming a third interlayer insulating layer on the substrate 100, performing a planarization process on the third interlayer insulating layer to expose the sacrificial capping pattern 127, and sequentially removing the sacrificial capping pattern 127, the sacrificial gate pattern 123, and the etch stop pattern 121 that are between the gate spacers 125.

After sequentially forming a gate insulating layer and a gate layer in the gap region, an etch-back process may be performed on the gate insulating layer and the gate layer to form the gate insulating pattern GI and the gate electrode GE. The gate insulating pattern GI may include a high-k dielectric material. In an implementation, the gate insulating pattern GI may include, e.g., hafnium oxide, hafnium silicate, zirconium oxide, and/or zirconium silicate. The gate insulating layer may be formed by, e.g., an atomic layer deposition process.

The gate electrode GE may include conductive metal nitride, e.g., titanium nitride or tantalum nitride, and/or metal, e.g., aluminum or tungsten.

The gate capping pattern 136 may be formed on the gate insulating pattern GI and the gate electrode GE to fill the gap region between the gate spacers 125. The gate capping pattern 136 may include, e.g., silicon oxide, silicon nitride, and/or silicon oxynitride.

When a sacrificial semiconductor layer serving as a mold for forming active patterns is formed using an etch process, an interfacial characteristic of an etched surface of the sacrificial semiconductor layer may be determined depending on a characteristic of the etch process. Crystallographic characteristics of active patterns grown from the etched surface may be degraded or non-uniform.

According to example embodiments, the sacrificial semiconductor layer SC, the etch stop layer ES, and the active layer AL may be continuously formed in-situ. Thus, the active layer AL forming the active patterns AP may be formed on the side surfaces of the sacrificial semiconductor layer SC, which are not etched surfaces, such that crystallographic characteristics and electrical characteristics of the active patterns AP may be enhanced. The sacrificial semiconductor layer SC, the etch stop layer ES, and the active layer AL may be continuously formed without deposition of at least one intervening non-semiconductor layer or an etch process, and the fabrication process may be simplified. Additionally, the active patterns AP may be formed using the sacrificial semiconductor layer SC, and a shape and a thickness of each active pattern AP may be adjusted.

Figure 12A:
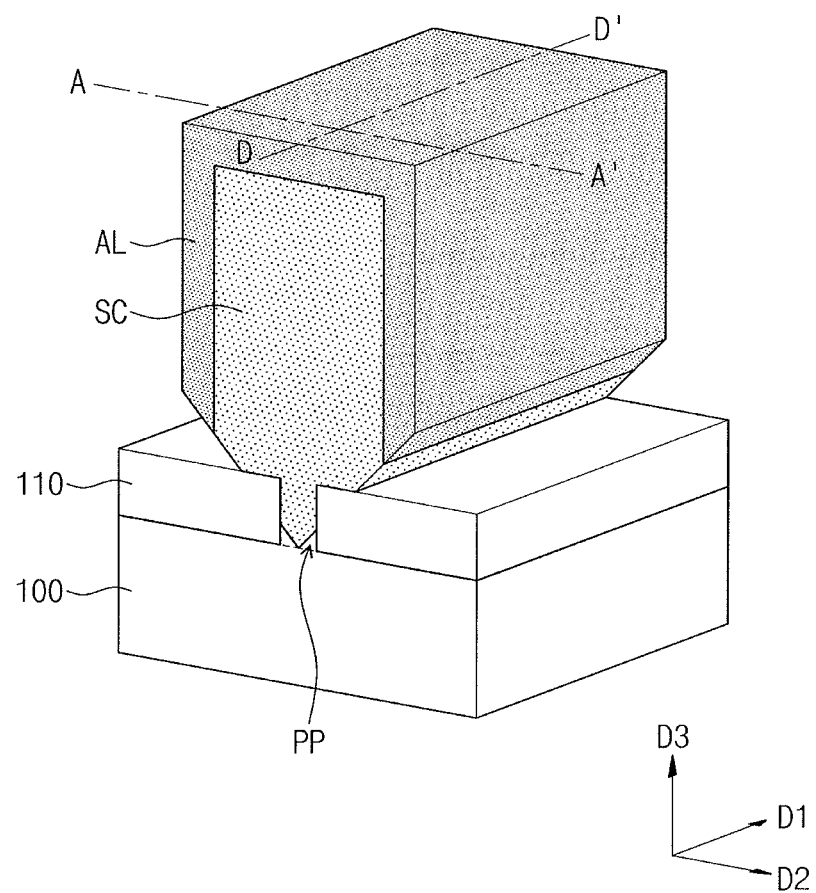
FIGS. 12A and 13A illustrate perspective views of stages in a method of fabricating a semiconductor device according to example embodiments.
Figure 12B:
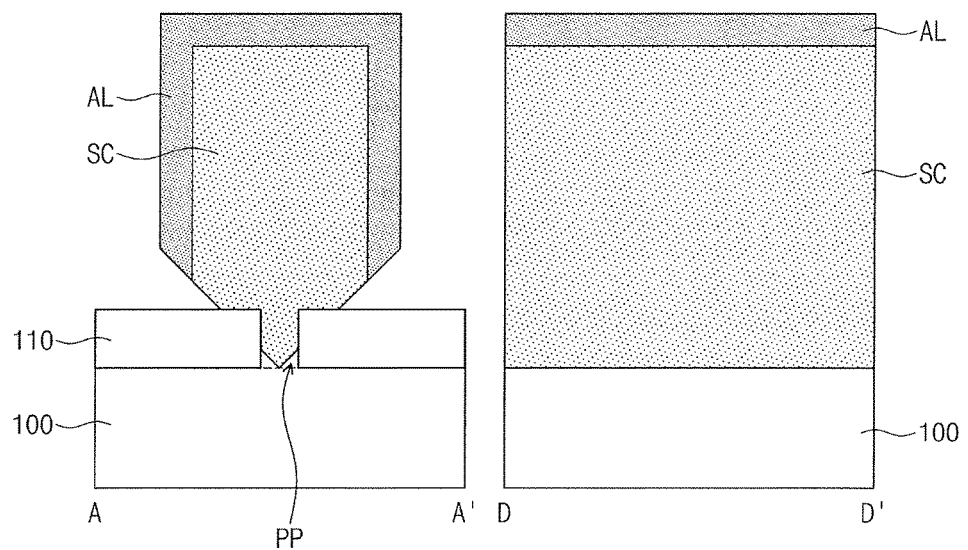
FIGS. 12B and 13B illustrate cross-sectional views taken along lines A-A' and D-D' of FIGS. 12A and 13A, respectively.
Figure 13A:
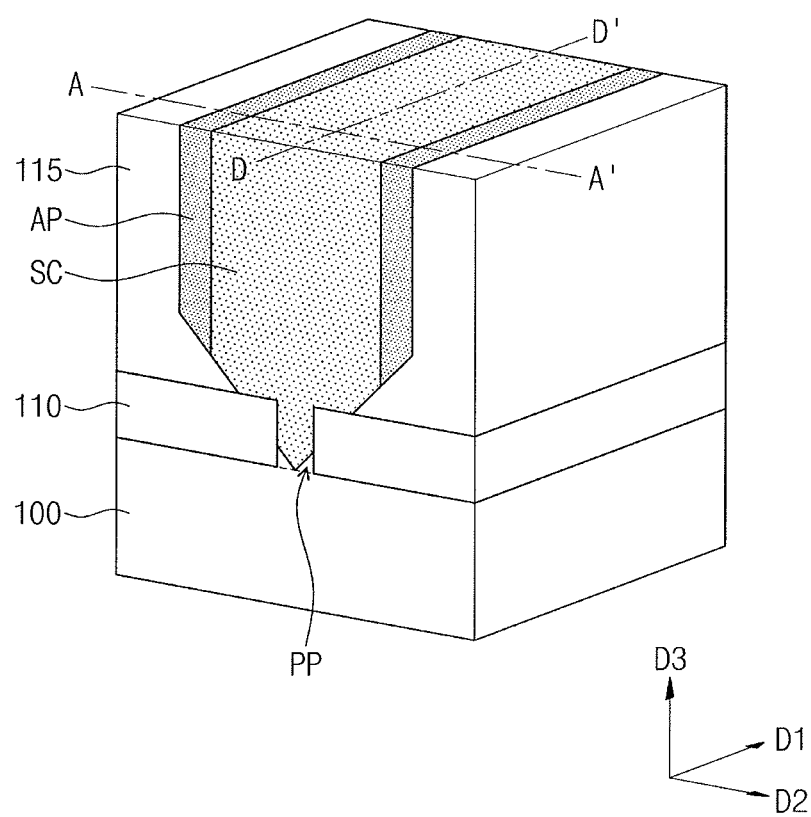
Figure 13B:
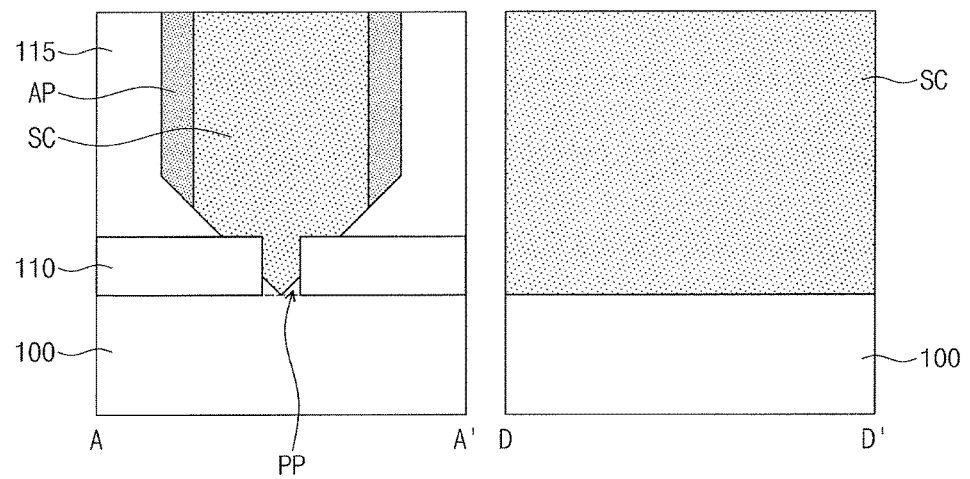

FIGS. 12A and 13A illustrate perspective views of stages in a method of fabricating a semiconductor device according to example embodiments. FIGS. 12B and 13B illustrate cross-sectional views taken along lines A-A' and D-D' of FIGS. 12A and 13A, respectively.

Referring to FIGS. 12A and 12B, the sacrificial semiconductor layer SC and the active layer AL may be formed on the resulting structure of FIGS. 5A and 5B. In the present embodiment, the etch stop layer ES shown in FIGS. 6A and 6B may be omitted. The sacrificial semiconductor layer SC and the active layer AL may each be formed of a material having an etch selectivity to each other. In an implementation, the sacrificial semiconductor layer SC is an InP layer, and the active layer AL may be an InGaAs layer. In an implementation, the sacrificial semiconductor layer SC and the active layer AL may be different layers selected from a Si, Ge, SiGe, SiSn, GeSn, GeC, SnC, and SiC layer.

Referring to FIGS. 13A and 13B, after forming the first interlayer insulating layer 115 to cover the active layer AL, a planarization process may be performed until an upper surface of the sacrificial semiconductor layer SC is exposed. Thus, the active layer AL may be separated into a pair of spaced active patterns AP with the sacrificial semiconductor pattern SC therebetween. The processes described with reference to FIGS. 8A to 11A, and 8B to 11B may be performed.

Figure 14:
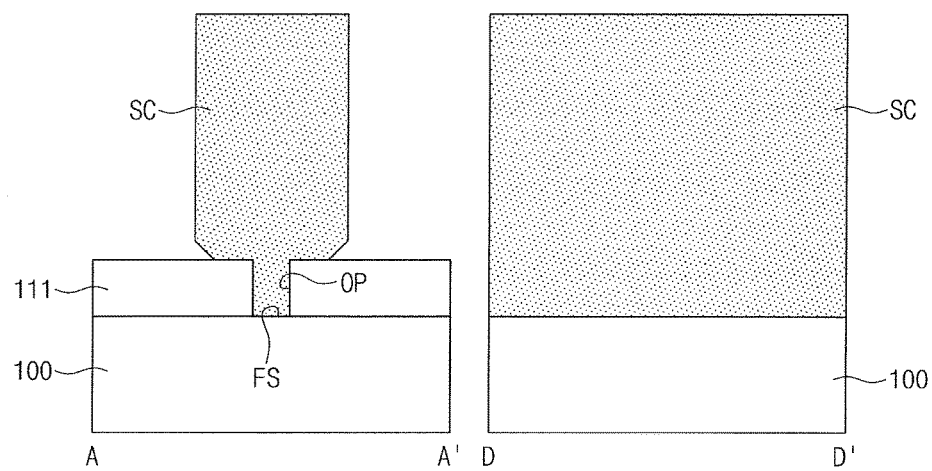
FIG. 14 illustrates a cross-sectional view of a stage in a method of fabricating a semiconductor device according to example embodiments.

FIG. 14 illustrates a cross-sectional view of a stage in a method of fabricating a semiconductor device according to example embodiments. FIG. 14 illustrates a cross-sectional view taken along lines A-A' and D-D' of FIG. 1.

Referring to FIG. 14, lower insulating patterns 111 may be formed on the substrate 100. The lower insulating patterns 111 may be formed by forming a lower insulating layer covering the substrate 100 and patterning the lower insulating layer to form the opening OP exposing an upper surface FS of the substrate 100. The exposed upper surface FS of the substrate 100 may be substantially flat. The sacrificial semiconductor layer SC may be formed using the upper surface FS of the substrate 100 as a seed. In an implementation, the lower insulating patterns 111 may be a part of a silicon on insulator (SOI) substrate. Thereafter, the same processes as described with reference to FIGS. 6A to 11A and 6B to 11B may be performed.

Figure 15A:
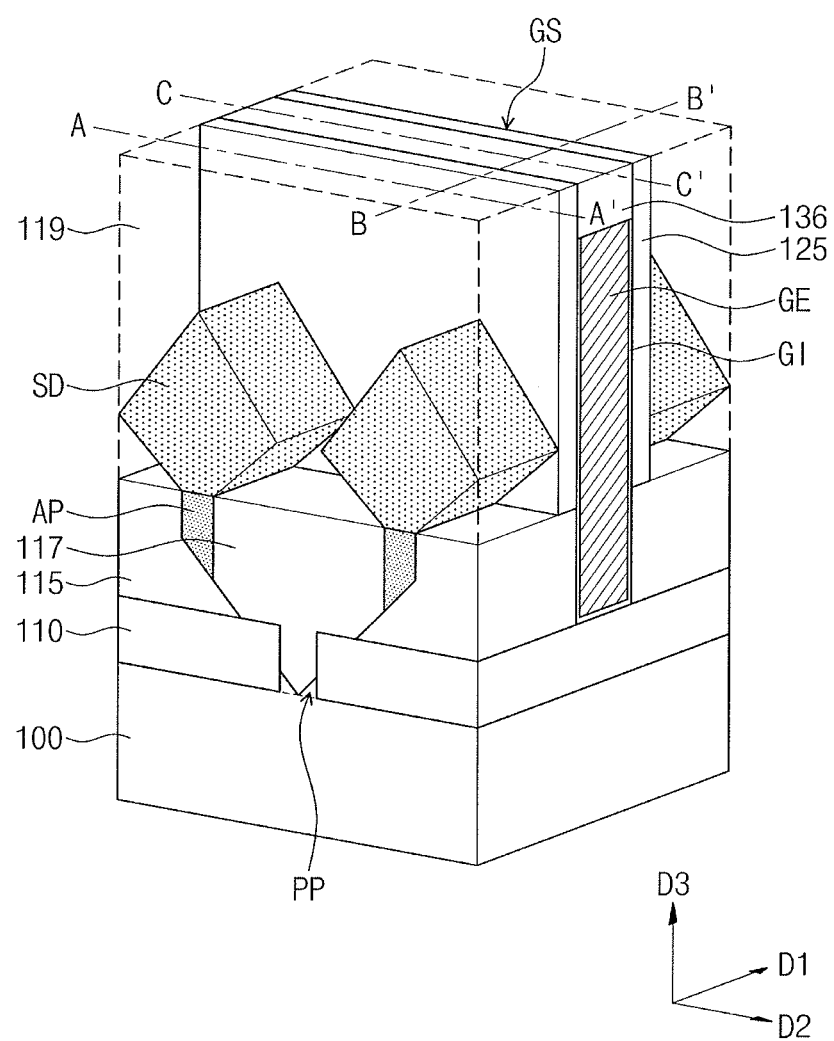
FIG. 15A illustrates a perspective view of a semiconductor device according to example embodiments.
Figure 15B:
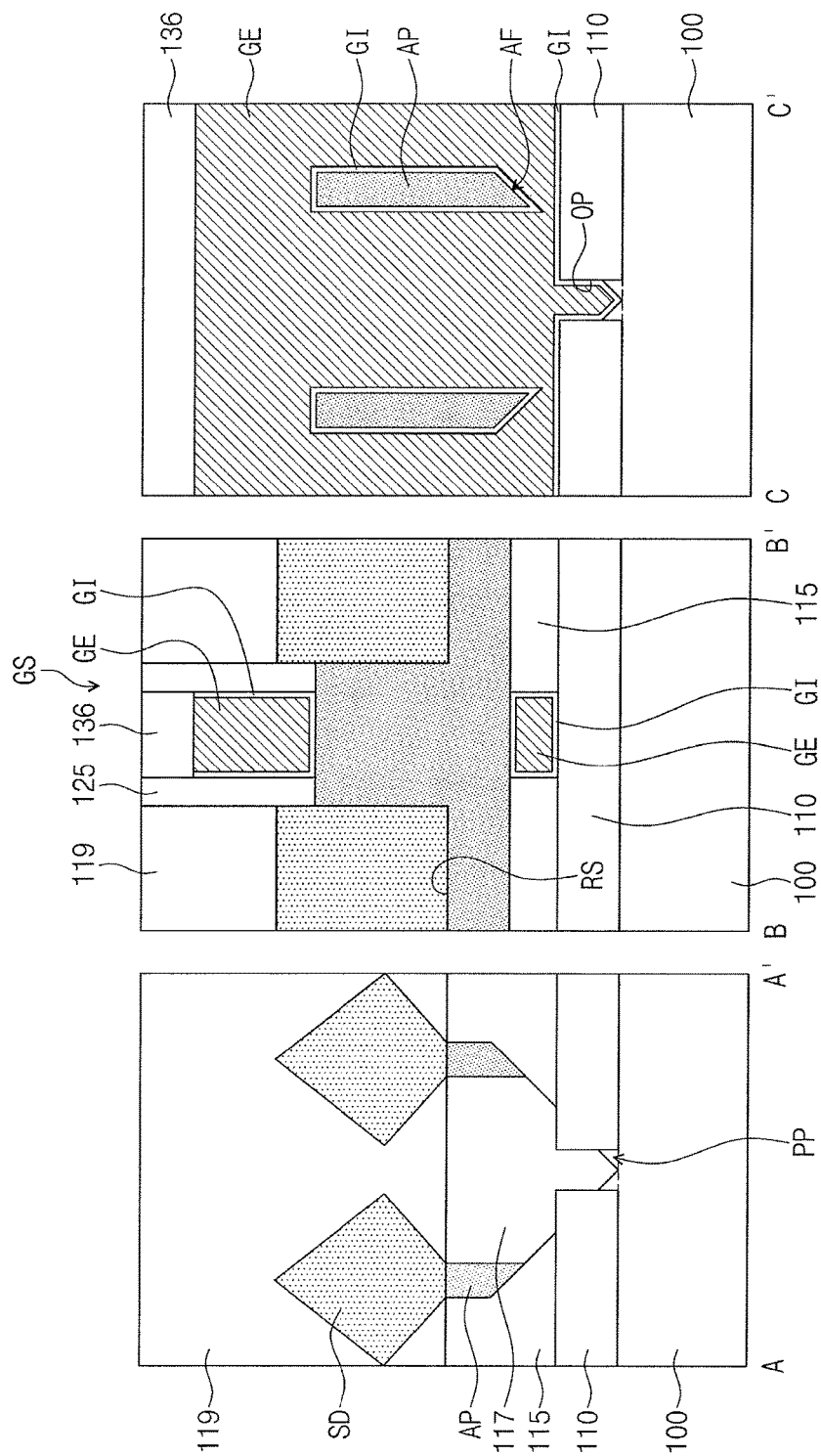
FIG. 15B illustrates a cross-sectional view taken along lines A-A', B-B', and C-C' of FIG. 15A.

FIG. 15A illustrates a perspective view of a semiconductor device according to example embodiments. FIG. 15B illustrates a cross-sectional view taken along lines A-A', B-B', and C-C' of FIG. 15A.

Referring to FIGS. 15A and 15B, the gate insulating pattern GI and the gate electrode GE may extend below the active patterns AP. The gate insulating pattern GI and the gate electrode GE may sequentially cover the lower surfaces AF of the active patterns AP. A shape of a lower portion of each of the gate insulating pattern GI and the gate electrode GE may be varied depending on a fabrication process to be described later. In an implementation, the gate insulating pattern GI and the gate electrode GE may extend into the opening OP. In an implementation, a portion of the first and second interlayer insulating layers 115 and 117 may remain on the isolation patterns 110, and the gate insulating pattern GI and the gate electrode GE may extend into the first and second interlayer insulating layers 115 and 117, below the lower surfaces AF of the active patterns AP.

Figure 16A:
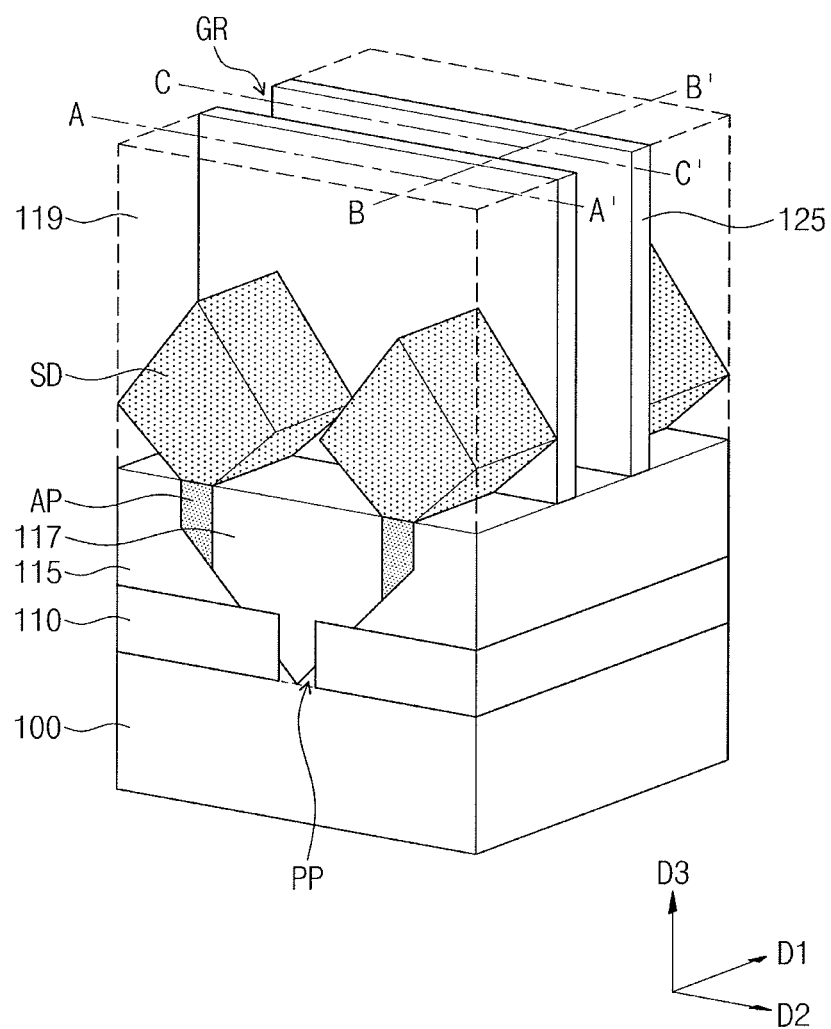
FIGS. 16A and 17A illustrate perspective views of stages in a method of fabricating a semiconductor device according to example embodiments.
Figure 16B:
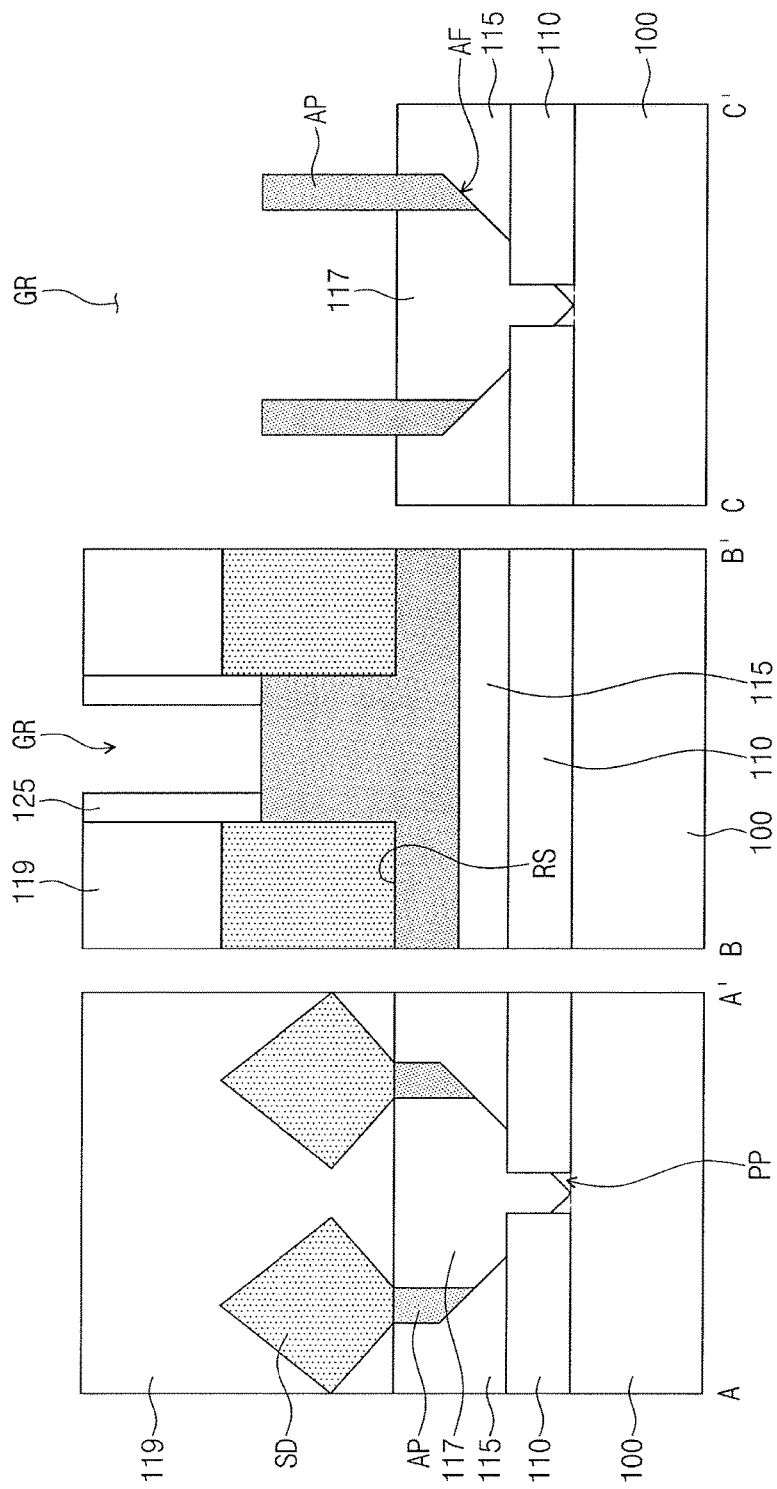
FIGS. 16B and 17B illustrate cross-sectional views taken along lines A-A', B-B', and C-C' of FIGS. 16A and 17A, respectively.
Figure 17A:
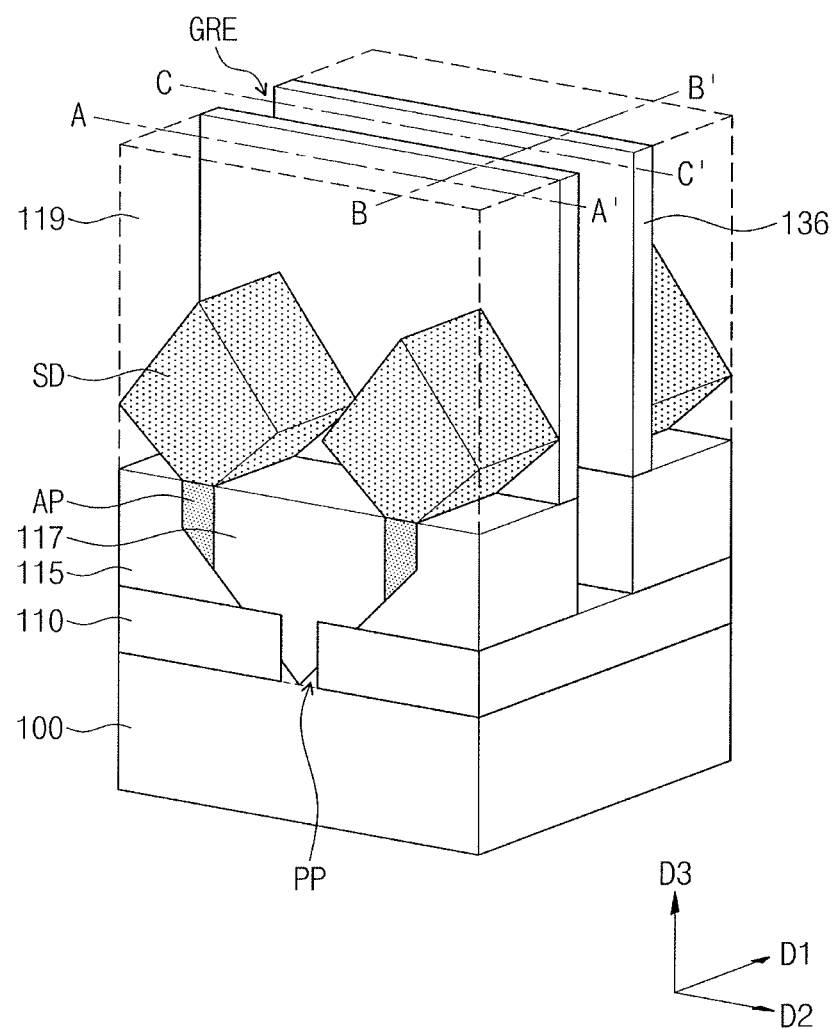
Figure 17B:
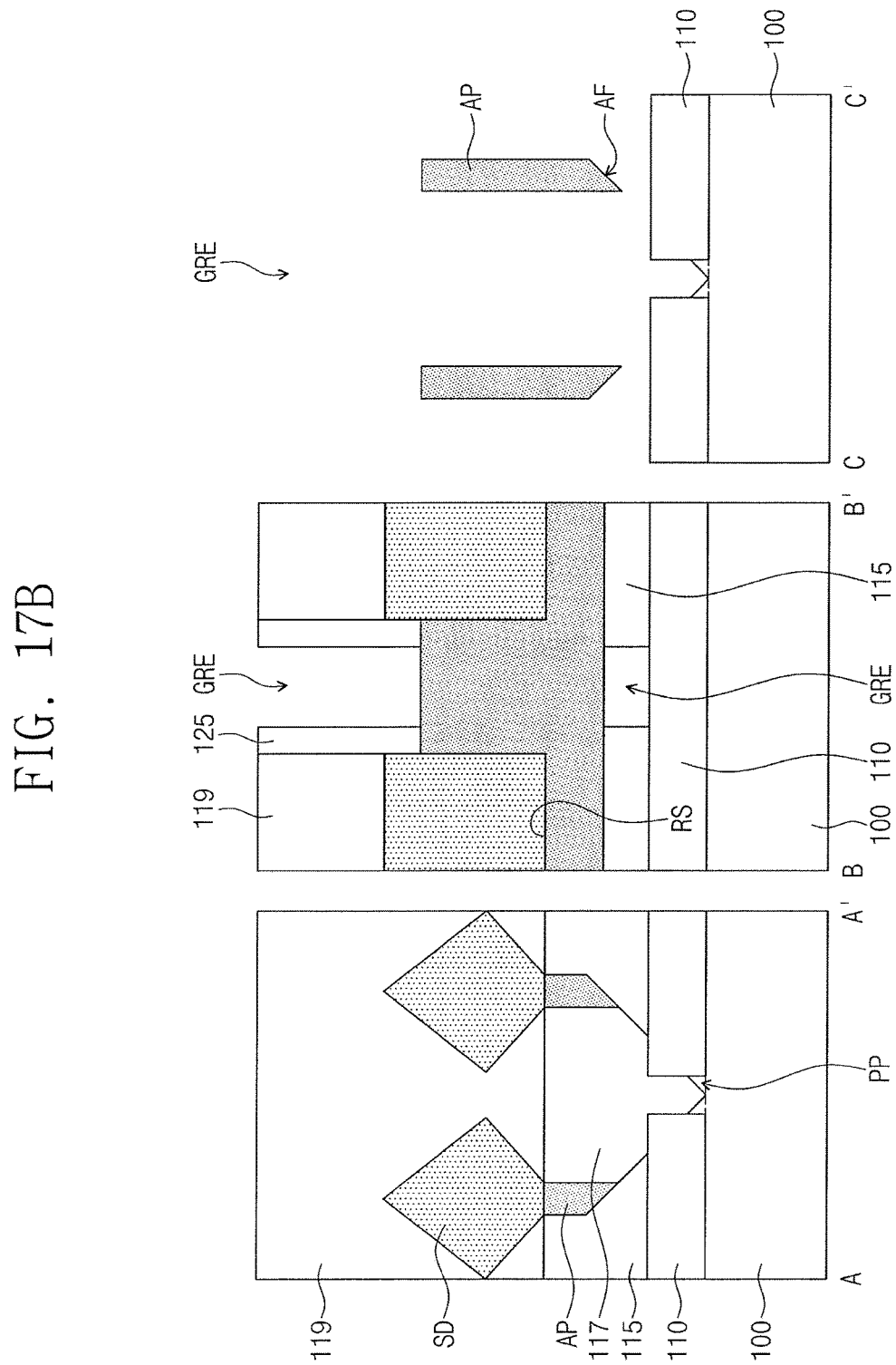

FIGS. 16A and 17A illustrate perspective views of stages in a method of fabricating a semiconductor device according to example embodiments. FIGS. 16B and 17B illustrate cross-sectional views taken along lines A-A', B-B', and C-C' of FIGS. 16A and 17A, respectively.

Referring to FIGS. 16A and 16B, in the resulting structure of FIGS. 11A and 11B, the sacrificial capping pattern 127, the sacrificial gate pattern 123, and the etch stop pattern 121 may be sequentially removed to form a gap region GR. The formation of the gap region GR may include forming a third interlayer insulating layer 119 on the substrate 100, planarizing the third interlayer insulating layer 119 to expose the sacrificial capping pattern 127, and sequentially removing the sacrificial capping pattern 127, the sacrificial gate pattern 123, and the etch stop pattern 121.

Referring to FIGS. 17A and 17B, an extension gap region GRE including the gap region GR and a space extending between the isolation patterns 110 and the active patterns AP may be formed. The extension gap region GRE may be formed by removing a portion of the first and second interlayer insulating layers 115 and 117 exposed by the gap region GR between the gate spacers 125. The extension gap region GRE may be formed by, e.g., a selective etch process. The lower surfaces AF of the active patterns AP may be exposed by the extension gap region GRE.

In an implementation, the isolation patterns 110 may be at least partly removed together with the first and second interlayer insulating layers 115 and 117. In an implementation, a portion of the first and second interlayer insulating layers 115 and 117 may remain below the active patterns AF.

Referring again to FIGS. 15A and 15B, the gate insulating pattern GI, the gate electrode GE, and the gate capping pattern 136 may be formed in the extension gap region GRE. The gate insulating pattern GI and the gate electrode GE may fill the space between the lower surfaces AF of the active patterns AP and the isolation patterns 110. Thereafter, the gate capping pattern 136 may be formed on the gate insulating pattern GI and the gate electrode GE, to fill a space between the gate spacers 125.

By way of summation and review, to increase the integration density of such devices, it may be desirable to reduce a size and a design rule of the semiconductor device. This may require a scaling-down of MOS transistors. Scaling-down of MOS transistors could lead to degradation in operational characteristics of the semiconductor device. Accordingly, various techniques aimed at fabricating highly integrated semiconductor devices that offer better performance are considered.

Against this backdrop, the embodiments may provide semiconductor devices including field effect transistors.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
    a substrate;
    an active pattern spaced apart from the substrate and extending in a first direction; and
    a gate structure on the active pattern and extending in a second direction crossing the first direction,
    wherein a lower portion of the active pattern extends in the first direction and includes a first lower surface that is sloped with respect to an upper surface of the substrate.

2. The semiconductor device according as claimed in claim 1, wherein the first lower surface is perpendicular to a [111] orientation of the active pattern.

3. The semiconductor device according as claimed in claim 1, wherein the first lower surface is a (111) surface.

4. The semiconductor device according as claimed in claim 1, wherein the upper surface of the substrate is a (100) surface.

5. The semiconductor device according as claimed in claim 1, wherein the lower portion of the active pattern further includes a second lower surface extending in the first direction, the second lower surface being substantially parallel to the upper surface of the substrate.

6. The semiconductor device according as claimed in claim 1, wherein the active pattern includes:
    a first side surface having a first height in a third direction perpendicular to the upper surface of the substrate; and
    a second side surface opposite to the first side surface and having a second height in the third direction, the second height being less than the first height.

7. The semiconductor device according as claimed in claim 1, wherein the active pattern has a fin shape or a plate shape.

8. The semiconductor device according as claimed in claim 1, further comprising an interlayer insulating layer on the substrate, wherein the lower portion of the active pattern is buried in the interlayer insulating layer.

9. The semiconductor device according as claimed in claim 8, further comprising an isolation pattern between the substrate and the interlayer insulating layer, wherein the active pattern is spaced apart from the isolation pattern.

10. The semiconductor device according as claimed in claim 1, wherein the active pattern includes a different material from a material of the substrate.

11. A semiconductor device, comprising:
    a substrate;
    a pair of active patterns spaced apart from the substrate; and
    a gate structure extending across the pair of active patterns,
    wherein a lower portion of each active pattern of the pair of active patterns includes a lower surface sloped with respect to an upper surface of the substrate, the lower portion of each active pattern of the pair of active patterns extending in a direction crossing an extension direction of the gate structure.

12. The semiconductor device according as claimed in claim 11, wherein the pair of active patterns are in mirror symmetry relative to a plane orthogonal to the upper surface of the substrate and equidistant from each of the active patterns.

13. The semiconductor device according as claimed in claim 11, wherein each active pattern of the pair of active patterns includes:

a first side surface having a first length in a perpendicular direction relative to the upper surface of the substrate; and a second side surface opposite to the first side surface and having a second length in the perpendicular direction, the second length being less than the first length.

14. The semiconductor device according as claimed in claim 13, wherein the first side surface of one active pattern of the pair of active patterns faces the first side surface of the other active pattern of the pair of active patterns.

15. The semiconductor device according as claimed in claim 11, further comprising an interlayer insulating layer on the substrate, wherein the lower portion of each active pattern of the pair of active patterns is buried in the interlayer insulating layer.

16. The semiconductor device according as claimed in claim 15, further comprising spaced isolation patterns between the substrate and the interlayer insulating layer, wherein each of the isolation patterns is located below a corresponding one of the pair of active patterns.

17. The semiconductor device according as claimed in claim 16, wherein:

the substrate includes a protrusion portion protruding between the isolation patterns, and in plan view, the protrusion portion extends between and parallel to the pair of active patterns.

18. The semiconductor device according as claimed in claim 11, wherein:

the gate structure includes a gate insulating pattern and a gate electrode, and the gate insulating pattern and the gate electrode extend between the substrate and the pair of active patterns.

19. The semiconductor device according as claimed in claim 11, wherein:

the upper surface of the substrate is a (100) surface, and the lower surface of each active pattern of the pair of active patterns is a (111) surface.

* * * * *